(12) United States Patent
Kusters et al.

(10) Patent No.: US 11,467,732 B2
(45) Date of Patent: Oct. 11, 2022

(54) DATA STORAGE SYSTEM WITH MULTIPLE DURABILITY LEVELS

(71) Applicant: Amazon Technologies, Inc., Seattle, WA (US)

(72) Inventors: Norbert P. Kusters, Redmond, WA (US); Nachiappan Arumugam, Seattle, WA (US); Christopher Nathan Watson, Seattle, WA (US); Marc John Brooker, Seattle, WA (US); David R. Richardson, Seattle, WA (US); Danny Wei, Seattle, WA (US); John Luther Guthrie, II, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/723,391

(22) Filed: Dec. 20, 2019

(65) Prior Publication Data
US 2020/0125271 A1 Apr. 23, 2020

Related U.S. Application Data

(63) Continuation of application No. 15/392,857, filed on Dec. 28, 2016, now Pat. No. 10,514,847.

(51) Int. Cl.
*G06F 3/06* (2006.01)
*G06F 12/0868* (2016.01)
(Continued)

(52) U.S. Cl.
CPC ............ *G06F 3/0608* (2013.01); *G06F 3/065* (2013.01); *G06F 3/067* (2013.01); *G06F 3/0614* (2013.01);
(Continued)

(58) Field of Classification Search
CPC .... G06F 3/0608; G06F 3/0614; G06F 3/0619; G06F 3/0622; G06F 3/0635;
(Continued)

(56) References Cited

U.S. PATENT DOCUMENTS

| 6,061,600 A | 5/2000 | Ying |
| 6,456,599 B1 | 9/2002 | Elliott |

(Continued)

FOREIGN PATENT DOCUMENTS

| WO | 2014039922 | 3/2014 |
| WO | 2016130301 | 8/2016 |

OTHER PUBLICATIONS

U.S. Appl. No. 15/392,806, filed Dec. 28, 2016, Norbert P Kusters et al.
(Continued)

*Primary Examiner* — Nanci N Wong
(74) *Attorney, Agent, or Firm* — Alexander A. Knapp; Kowert, Hood, Munyon, Rankin & Goetzel, P.C.

(57) ABSTRACT

A data storage system includes multiple head nodes and multiple data storage sleds mounted in a rack. For a particular volume or volume partition one of the head nodes is designated as a primary head node for the volume or volume partition. The primary head node is configured to store data for the volume in a data storage of the primary head node and cause the data to be replicated to a secondary head node. The primary head node is also configured to cause the data for the volume to be stored in a plurality of respective mass storage devices each in different ones of the plurality of data storage sleds of the data storage system.

20 Claims, 24 Drawing Sheets

(51) Int. Cl.
   *H04L 67/1095* (2022.01)
   *G11B 33/12* (2006.01)
   *H03M 13/15* (2006.01)
   *H04L 67/2885* (2022.01)
   *H04L 67/1097* (2022.01)
   *H04L 67/568* (2022.01)

(52) U.S. Cl.
   CPC ......... *G06F 3/0619* (2013.01); *G06F 3/0622* (2013.01); *G06F 3/0635* (2013.01); *G06F 3/0644* (2013.01); *G06F 3/0647* (2013.01); *G06F 3/0659* (2013.01); *G06F 3/0685* (2013.01); *G06F 12/0868* (2013.01); *H04L 67/1095* (2013.01); *G06F 2212/214* (2013.01); *G06F 2212/222* (2013.01); *G06F 2212/262* (2013.01); *G06F 2212/286* (2013.01); *G06F 2212/461* (2013.01); *G06F 2212/466* (2013.01); *G06F 2212/7208* (2013.01); *G11B 33/128* (2013.01); *H03M 13/154* (2013.01); *H04L 67/1097* (2013.01); *H04L 67/2885* (2013.01); *H04L 67/568* (2022.05); *Y02D 10/00* (2018.01)

(58) Field of Classification Search
   CPC ...... G06F 3/0644; G06F 3/0647; G06F 3/065; G06F 3/0659; G06F 3/067; G06F 3/0685; G06F 12/0868; G06F 2212/214; G06F 2212/222; G06F 2212/262; G06F 2212/286; G06F 2212/461; G06F 2212/466; G06F 2212/7208; H04L 67/1095; H04L 67/1097; H04L 67/2842; H04L 67/2885; H03M 13/154
   See application file for complete search history.

(56) References Cited

U.S. PATENT DOCUMENTS

| | | | |
|---|---|---|---|
| 6,993,034 B1 | 1/2006 | Block | |
| 7,254,682 B1 | 8/2007 | Arbon | |
| 7,376,138 B1 | 5/2008 | Cotter | |
| 7,502,840 B1 | 3/2009 | Bakke | |
| 7,596,712 B1 | 9/2009 | Gole et al. | |
| 7,702,618 B1 | 4/2010 | Patterson | |
| 7,734,867 B1 * | 6/2010 | Keeton | G06F 3/0634 711/114 |
| 7,752,180 B1 | 7/2010 | Fair | |
| 7,941,621 B1 | 5/2011 | Gipp et al. | |
| 8,589,550 B1 | 11/2013 | Faibish et al. | |
| 8,612,627 B1 | 12/2013 | Brandwine | |
| 8,612,701 B1 | 12/2013 | Park | |
| 8,688,660 B1 | 4/2014 | Sivasubramanian et al. | |
| 9,075,773 B1 | 7/2015 | Rakitzis et al. | |
| 9,304,867 B2 | 4/2016 | Sivasubramanian et al. | |
| 9,342,457 B2 | 5/2016 | Wei et al. | |
| 9,563,385 B1 | 2/2017 | Kowalski et al. | |
| 9,619,429 B1 | 4/2017 | Wang et al. | |
| 9,722,976 B1 | 8/2017 | Li et al. | |
| 9,733,862 B1 | 8/2017 | Klemm | |
| 9,785,510 B1 | 10/2017 | Madhavarapu et al. | |
| 9,787,654 B2 | 10/2017 | Vincent et al. | |
| 9,985,904 B2 | 5/2018 | Shalev et al. | |
| 10,055,352 B2 | 8/2018 | Wei et al. | |
| 10,057,187 B1 | 8/2018 | Dhoolam et al. | |
| 10,148,570 B2 | 12/2018 | Shalev et al. | |
| 10,484,015 B2 | 11/2019 | Kusters et al. | |
| 10,509,601 B2 | 12/2019 | Kusters et al. | |
| 10,514,847 B2 | 12/2019 | Kusters et al. | |
| 10,521,135 B2 | 12/2019 | Kusters et al. | |
| 10,715,460 B2 | 7/2020 | Brooker | |
| 10,771,550 B2 | 9/2020 | Kusters | |
| 11,010,064 B2 | 5/2021 | Kusters et al. | |
| 11,169,723 B2 | 11/2021 | Kusters et al. | |
| 2001/0044879 A1 | 11/2001 | Moulton et al. | |
| 2002/0108017 A1 | 8/2002 | Kenchammana-Hoskote | |
| 2002/0112178 A1 | 8/2002 | Scherr | |
| 2003/0110409 A1 | 6/2003 | Gale et al. | |
| 2004/0003111 A1 | 1/2004 | Maeda | |
| 2004/0081105 A1 | 4/2004 | Shimazaki et al. | |
| 2004/0111557 A1 | 6/2004 | Nakatani | |
| 2004/0127277 A1 | 7/2004 | Walker et al. | |
| 2005/0138461 A1 | 6/2005 | Allen | |
| 2005/0198371 A1 | 9/2005 | Smith et al. | |
| 2005/0240286 A1 | 10/2005 | Glanzer et al. | |
| 2006/0095478 A1 | 5/2006 | Cherkauer | |
| 2006/0155946 A1 | 7/2006 | Ji | |
| 2007/0019540 A1 | 1/2007 | Biswas et al. | |
| 2007/0038900 A1 | 2/2007 | Kisel | |
| 2007/0106868 A1 | 5/2007 | Moore | |
| 2007/0130424 A1 | 6/2007 | Hashimoto | |
| 2007/0174660 A1 | 7/2007 | Peddada | |
| 2007/0217408 A1 | 9/2007 | Sahashi | |
| 2008/0002580 A1 | 1/2008 | Kawada et al. | |
| 2008/0059697 A1 * | 3/2008 | Sakaki | G06F 3/0604 711/112 |
| 2008/0072000 A1 | 3/2008 | Osaki | |
| 2008/0181382 A1 | 7/2008 | Lean | |
| 2008/0205399 A1 | 8/2008 | Delesalle et al. | |
| 2009/0034377 A1 * | 2/2009 | English | G06F 3/0656 369/47.13 |
| 2009/0172816 A1 | 7/2009 | Maino | |
| 2009/0217067 A1 | 8/2009 | Radhakrishnan | |
| 2009/0254702 A1 | 10/2009 | Kumano | |
| 2010/0074157 A1 | 3/2010 | Doh et al. | |
| 2010/0153638 A1 | 6/2010 | Yochai | |
| 2010/0180153 A1 | 7/2010 | Jernigan, IV | |
| 2010/0198972 A1 | 8/2010 | Umbehocker | |
| 2011/0022574 A1 | 1/2011 | Hansen | |
| 2011/0078108 A1 | 3/2011 | Kumar | |
| 2011/0179231 A1 | 7/2011 | Roush | |
| 2011/0238857 A1 | 9/2011 | Certain et al. | |
| 2011/0289049 A1 | 11/2011 | Zeng et al. | |
| 2012/0030426 A1 | 2/2012 | Satran | |
| 2012/0179771 A1 | 7/2012 | Ganti | |
| 2013/0067159 A1 | 3/2013 | Mehra | |
| 2013/0067187 A1 | 3/2013 | Moss | |
| 2013/0115915 A1 | 5/2013 | Tipton | |
| 2013/0173955 A1 | 7/2013 | Hallak | |
| 2013/0223277 A1 | 8/2013 | DeCusatis et al. | |
| 2013/0271904 A1 | 10/2013 | Hormuth | |
| 2013/0282978 A1 | 10/2013 | Kumar et al. | |
| 2013/0311539 A1 | 11/2013 | Ngai | |
| 2014/0006543 A1 | 1/2014 | Pitts | |
| 2014/0032727 A1 | 1/2014 | Kano et al. | |
| 2014/0047263 A1 | 2/2014 | Coatney | |
| 2014/0081927 A1 | 3/2014 | Lipcon | |
| 2014/0092833 A1 | 4/2014 | Vannithamby et al. | |
| 2014/0108755 A1 | 4/2014 | Lue et al. | |
| 2014/0164694 A1 | 6/2014 | Storer | |
| 2014/0173185 A1 * | 6/2014 | Belluomini | G06F 11/1415 711/103 |
| 2014/0201483 A1 | 7/2014 | Min | |
| 2014/0282993 A1 | 9/2014 | Van Till | |
| 2014/0304383 A1 | 10/2014 | Guo et al. | |
| 2014/0304469 A1 | 10/2014 | Wu | |
| 2015/0026508 A1 * | 1/2015 | Jacobs | G06F 11/1658 714/4.11 |
| 2015/0036284 A1 | 2/2015 | Ross et al. | |
| 2015/0058475 A1 | 2/2015 | Earl | |
| 2015/0081767 A1 | 3/2015 | Evens | |
| 2015/0106549 A1 * | 4/2015 | Brown | G06F 3/0679 711/103 |
| 2015/0113314 A1 | 4/2015 | Bulkowski | |
| 2015/0121028 A1 | 4/2015 | Gupta et al. | |
| 2015/0127975 A1 | 5/2015 | Patterson | |
| 2015/0208320 A1 | 7/2015 | Alexander | |
| 2015/0222705 A1 | 8/2015 | Stephens | |
| 2015/0261443 A1 | 9/2015 | Wei et al. | |
| 2015/0261674 A1 | 9/2015 | Wei et al. | |
| 2015/0277797 A1 | 10/2015 | Lv | |
| 2015/0278243 A1 | 10/2015 | Pradeep et al. | |
| 2015/0296404 A1 | 10/2015 | Sharma | |

(56) References Cited

U.S. PATENT DOCUMENTS

| | | |
|---|---|---|
| 2015/0309892 A1 | 10/2015 | Ramasubramaniam et al. |
| 2015/0313028 A1 | 10/2015 | Bell et al. |
| 2015/0324123 A1 | 11/2015 | Storer |
| 2015/0326531 A1 | 11/2015 | Cui et al. |
| 2015/0362983 A1 | 12/2015 | Frick |
| 2015/0378762 A1 | 12/2015 | Saladi |
| 2015/0379009 A1* | 12/2015 | Reddy ................ G06F 16/2343 707/747 |
| 2016/0057629 A1 | 2/2016 | Dong |
| 2016/0062685 A1 | 3/2016 | Sundararajan |
| 2016/0073544 A1 | 3/2016 | Heyd et al. |
| 2016/0080495 A1 | 3/2016 | Bilas et al. |
| 2016/0085674 A1 | 3/2016 | Sterns |
| 2016/0092263 A1 | 3/2016 | Gleyzer |
| 2016/0124669 A1 | 5/2016 | Harris |
| 2016/0162787 A1 | 6/2016 | Kumaran et al. |
| 2016/0182305 A1 | 6/2016 | Martin et al. |
| 2016/0182399 A1 | 6/2016 | Zadka |
| 2016/0217823 A1* | 7/2016 | Arslan ................ G06F 11/1008 |
| 2016/0239384 A1 | 8/2016 | Silk |
| 2016/0246677 A1 | 8/2016 | Sangamkar et al. |
| 2016/0246719 A1 | 8/2016 | Teletia et al. |
| 2016/0259693 A1 | 9/2016 | Sundararaman et al. |
| 2016/0278067 A1* | 9/2016 | Badam ................ G06F 1/3275 |
| 2016/0292025 A1 | 10/2016 | Gupta |
| 2016/0320978 A1 | 11/2016 | Barve |
| 2016/0328168 A1 | 11/2016 | Wei et al. |
| 2016/0342349 A1 | 11/2016 | Borlick et al. |
| 2016/0371145 A1 | 12/2016 | Akutsu et al. |
| 2016/0371222 A1 | 12/2016 | Yifrach |
| 2017/0004057 A1 | 1/2017 | Brown et al. |
| 2017/0054626 A1 | 2/2017 | Sivabalan et al. |
| 2017/0055305 A1 | 2/2017 | Kurian |
| 2017/0063397 A1 | 3/2017 | Richardson et al. |
| 2017/0132091 A1 | 5/2017 | Leshinsky et al. |
| 2017/0149883 A1* | 5/2017 | Joshi ................ H04L 67/16 |
| 2017/0161162 A1* | 6/2017 | Blea ................ G06F 11/2094 |
| 2017/0177222 A1 | 6/2017 | Singh et al. |
| 2017/0223717 A1 | 8/2017 | Athani |
| 2017/0262191 A1 | 9/2017 | Dewakar et al. |
| 2017/0277590 A1* | 9/2017 | Luse ................ G06F 3/0619 |
| 2017/0344285 A1* | 11/2017 | Choi ................ G06F 3/065 |
| 2017/0364295 A1 | 12/2017 | Sardinha et al. |
| 2017/0371573 A1 | 12/2017 | Kim et al. |
| 2017/0371580 A1 | 12/2017 | Kowles |
| 2018/0004414 A1 | 1/2018 | Danilov et al. |
| 2018/0011642 A1 | 1/2018 | Koseki et al. |
| 2018/0018235 A1 | 1/2018 | Arslan |
| 2018/0060168 A1 | 3/2018 | Kelly |
| 2018/0074973 A1 | 3/2018 | Chan |
| 2018/0096066 A1 | 4/2018 | Venkataramanapa |
| 2018/0097657 A1 | 4/2018 | Dao et al. |
| 2018/0131633 A1 | 5/2018 | Li |
| 2018/0150256 A1 | 5/2018 | Kumar |
| 2018/0176302 A1 | 6/2018 | Lewis |
| 2018/0183868 A1 | 6/2018 | Kusters |
| 2019/0324666 A1 | 10/2019 | Kusters et al. |
| 2020/0083909 A1 | 3/2020 | Kusters et al. |
| 2020/0117399 A1 | 4/2020 | Kusters et al. |
| 2020/0404055 A1 | 12/2020 | Kusters |
| 2021/0263658 A1 | 8/2021 | Kusters et al. |
| 2022/0005795 A1 | 1/2022 | Hu et al. |

OTHER PUBLICATIONS

U.S. Appl. No. 15/392,835, filed Dec. 28, 2016, Norbert P. Kusters et al.
U.S. Appl. No. 15/392,878, filed Dec. 28, 2016, Norbert P. Kusters et al.
U.S. Appl. No. 15/433,951, filed Feb. 15, 2017, Norbert Paul Kusters et al.
U.S. Appl. No. 15/433,956, filed Feb. 15, 2017, Norbert Paul Kusters et al.
U.S. Appl. No. 14/983,436, filed Dec. 29, 2015, Leah Shalev.
International Search Report and Written Opinion from PCT/US2017/068430, dated Mar. 21, 2018, Amazon Technologies, Inc., pp. 1-14.
International Search Report and Written Opinion from PCT/US2017/068429, dated Mar. 21, 2018, Amazon Technologies Inc., pp. 1-13.
Salvador Esparza et al "Oracle Exalogic Elastic Cloud Machine Owner's Guide" Apr. 30, 2015, pp. 1-302.
U.S. Appl. No. 14/625,535, filed Feb. 18, 2015, Surya Prakash Dhoolam.
U.S. Appl. No. 14/643,479, filed Mar. 10, 2015, Christopher Magee Greenwood.

* cited by examiner

DATA STORAGE SYSTEM WITH MULTIPLE DURABILITY LEVELS

This application is a continuation of U.S. patent application Ser. No. 15/392,857, filed Dec. 28, 2016, which is hereby incorporated by reference herein in its entirety.

BACKGROUND

The recent revolution in technologies for dynamically sharing virtualizations of hardware resources, software, and information storage across networks has increased the reliability, scalability, and cost efficiency of computing. More specifically, the ability to provide on demand virtual computing resources and storage through the advent of virtualization has enabled consumers of processing resources and storage to flexibly structure their computing and storage costs in response to immediately perceived computing and storage needs. Virtualization allows customers to purchase processor cycles and storage at the time of demand, rather than buying or leasing fixed hardware in provisioning cycles that are dictated by the delays and costs of manufacture and deployment of hardware. Rather than depending on the accuracy of predictions of future demand to determine the availability of computing and storage, users are able to purchase the use of computing and storage resources on a relatively instantaneous as-needed basis.

Virtualized computing environments are frequently supported by block-based storage. Such block-based storage provides a storage system that is able to interact with various computing virtualizations through a series of standardized storage calls that render the block-based storage functionally agnostic to the structural and functional details of the volumes that it supports and the operating systems executing on the virtualizations to which it provides storage availability.

Some block-based storage systems utilize a server node and multiple storage nodes that are serviced by the server node or dual server nodes that service multiple storage nodes. For example, a storage area network (SAN) may include such an architecture. However, in such systems, a failure of one or more of the server nodes may result in a large amount of storage capacity served by the server node(s) being rendered unusable or may result in significant decreases in the ability of the storage system to service read and write requests.

In order to increase durability of data, some block-based storage systems may store data across multiple devices in multiple locations. For example, a SAN may span multiple locations such as different facilities or different geographic locations. Such systems may utilize a common control plane to manage data in the multiple locations. However, in such systems, a failure of a component of the common control plane may impact a large quantity of storage capacity and render the large quantity of storage capacity unavailable. Also, such systems may require extensive networks to move data between the multiple locations and may also result in high latencies for data recovery due to data being located across the multiple locations.

Figure 1:
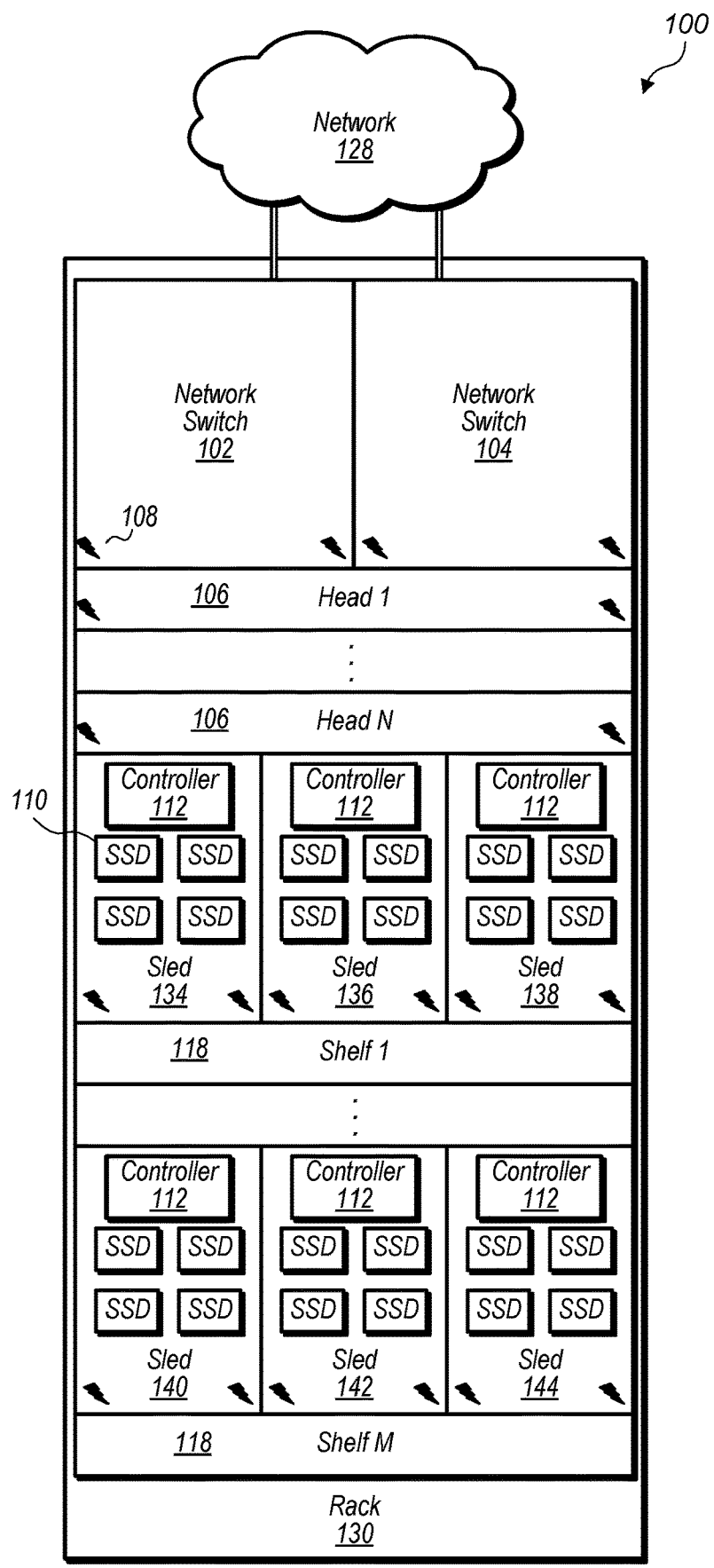
FIG. 1 illustrates a data storage unit comprising head nodes and data storage sleds, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

According to one embodiment, a data storage system includes a rack, a plurality of head nodes mounted in the rack, and a plurality of data storage sleds mounted in the rack. For a partition of a volume to be stored in the data storage system, a particular one of the head nodes is designated as a primary head node for the volume partition and another one of the head nodes is designated as a secondary head node for the volume partition. In response to receiving a write request for the volume partition, the head node designated as the primary head node for the volume partition is configured to write data included with the write request to a storage of the head node designated as the primary head node and cause the data included with the write request to be replicated to the other head node designated as the secondary head node. Furthermore, the head node designated as the primary head node for the volume partition is further configured to cause respective parts of the data stored in the storage of the head node to be stored in a plurality of respective mass storage devices each in different ones of the plurality of data storage sleds of the data storage system. For example, a data storage system may store data in a storage of a primary head node and replicate the data to a storage of a secondary head node. Then, after a certain amount of time has passed, a certain amount of data has been written for the volume partition, or in response to another trigger, the head node may cause the data stored in the storage of the head node to be stored in multiple mass storage devices of different ones of the data storage sleds of the data storage system. For example, data may be stored in mass storage devices of different data storage sleds of a data storage system in a RAID array and may be erasure encoded across the multiple mass storage devices. Such a system may provide varying latencies for accessing stored data and different durabilities of the stored data based on whether the data is stored in storages of the primary and secondary head nodes or stored in multiple mass storage devices of multiple data storage sleds of the data storage system. For example, data stored in a storage of a primary head node may be accessed with lower latencies than data stored across multiple data storage sleds of a data storage system. However, data stored across multiple data storage sleds of a data storage system may have higher durability than data replicated between storages of a primary and secondary head node. Thus, a data storage system may provide low latencies for recently or frequently accessed data while providing high durability for long term storage of data or for data less frequently accessed. In some embodiments, durability of data stored and replicated in head nodes may be adjusted by varying a number of head nodes that replicate the data. Also, durability of data stored in mass storage devices of data storage sleds of a data storage system may be adjusted by varying a RAID scheme or data encoding procedure used to store the data amongst other techniques to increase data durability.

According to one embodiment, a data storage system includes a head node of a data storage system, wherein a plurality of data storage sleds of the data storage system are also included in the data storage system. The head node, when acting as a primary head node of the data storage system for the volume partition and in response to receiving a write request for a volume partition, is configured to write data included with the write request to a storage of the head node and cause the data included with the write request to be replicated to another head node of the data storage system designated as a secondary head node for the volume partition. The head node is further configured to cause respective parts of the data stored in the storage of the head node to be stored in a plurality of respective mass storage devices each in different ones of the plurality of data storage sleds mounted in the rack of the data storage system.

According to one embodiment, a non-transitory computer readable medium stores program instructions for implementing a head node of a data storage system, wherein the program instructions when executed by a processor cause the system to, in response to receiving a write request for a volume partition, write data included with the write request to a storage of a head node designated as primary head node for the volume partition and cause the data included with the write request to be replicated to another head node of the data storage system designated as a secondary head node for the volume partition. The program instructions when executed by the processor further cause respective parts of the data stored in the storage of the head node designated as the primary head node to be stored in a plurality of respective mass storage devices each in different ones of a plurality of data storage sleds mounted in a rack of the data storage system.

According to one embodiment, a data storage system includes a plurality of data storage units, for example that are each hosted on a rack, a plurality of head nodes mounted in the rack, and a plurality of data storage sleds. The data storage system also includes one or more computing devices external to the plurality of data storage units configured to implement a zonal control plane for partially controlling storage operations related to the plurality of data storage units. In response to a volume creation request, the zonal control plane is configured to assign a particular one of the data storage units to service a volume requested by the volume creation request. Also, for each respective data storage unit, at least one of the head nodes of the respective data storage unit is configured to implement a local control plane for the respective data storage unit, wherein the plurality of head nodes are configured to service read requests and write requests directed to one or more volumes stored in the respective data storage unit independent of the local control plane and the zonal control plane. For example, a data storage system may include data storage units that are configured to service read and write requests without the read and write requests being routed through a local control plane or a zonal control plane of the data storage system. Also, the data storage units of the data storage system may continue to service read and write requests from client devices regardless of whether communication with a local control plane or a zonal control plane of the data storage system is available or lost.

According to one embodiment, a data storage system includes a data storage unit comprising a plurality of head nodes and a plurality of data storage sleds. At least one of the head nodes of the data storage unit implements a local control plane for the data storage unit, wherein, in response to a volume creation request, the local control plane is configured to receive an assignment from a zonal control plane to service a volume requested by the volume creation request, wherein the zonal control plane at least partially controls storage operations related to the data storage unit and one or more additional data storage units. Furthermore, the plurality of head nodes of the data storage unit are configured to service read requests and write requests directed to one or more volumes serviced by the data storage unit independent of the zonal control plane. For example, once a volume is created on a particular data storage unit in response to a zonal control plane receiving a volume creation request, the data storage unit may service read and write requests directed to the volume independent of the zonal control plane.

According to one embodiment, a method includes receiving, from a zonal control plane by a local control plane of a data storage unit, an assignment of a volume to be serviced by the data storage unit, wherein the data storage unit comprises a plurality of head nodes and a plurality of data storage sleds, wherein at least one of the head nodes implements the local control plane of the data storage unit. The method further includes assigning, by the local control plane, a particular one of the head nodes of the data storage unit to function as a primary head node for the volume; assigning, by the local control plane, another particular one of the head nodes of the data storage unit to function as a secondary head node from the volume; and in response to a read or write request for the volume, servicing, by the primary head node of the data storage unit, the read or write request independent of the zonal control plane.

According to one embodiment a data storage system includes a plurality of head nodes and a plurality of data storage sleds. Each of the data storage sleds includes multiple mass storage devices and a sled controller for the plurality of mass storage devices mounted in the data storage sled. Respective ones of the head nodes are configured to obtain credentials for accessing particular portions of the mass storage devices of respective ones of the plurality of data storage sleds. For example, a head node may receive a credential from a local control plane implemented on one or more of the head nodes of the data storage unit or may receive credentials from a zonal control plane implemented on one or more computing devices external to the data storage unit. Each of the respective sled controllers, in response to a request from a particular head node to write data on a particular portion of a particular mass storage device in a particular data storage sled that includes the respective sled controller, is configured to determine whether a credential included with the write request from the particular head node is a valid credential for accessing the particular portion of the particular mass storage device. In response to determining the credential is a valid credential for the particular portion of the particular mass storage device, the respective sled controller is configured to cause the requested write to be performed on the particular portion of the particular mass storage device. Also, in response to determining the credential is an invalid credential for the particular portion of the particular mass storage device, the respective sled controller is configured to decline to perform the requested write and return a message to the particular head node indicating the credential for accessing the particular portion of the particular mass storage device is an invalid credential. For example, if a credential for writing to a particular portion of a mass storage device is issued to a head node functioning as a primary head node for a volume and another head node of the data storage unit attempts to write to the particular portion of the mass storage device without a credential or with an inferior credential that is inferior to the credential held by the primary head node, the sled controller of the data storage sled may enforce the fencing off of the particular portion of the mass storage device for the head node functioning as the primary head node for the volume by refusing to perform the write requested by the other head node of the data storage unit. Also, in some embodiments, a head node functioning as a primary head node may determine that it has been superseded as primary head node by another head node of a data storage unit in response to a write request being denied by a sled controller. Such a scheme may prevent corruption of data caused by a head node attempting to write to a particular portion of a mass storage device after another head node of a data storage unit has taken over as primary head node and assumed exclusive responsibility for writing new data to the particular portion of the mass storage device.

According to one embodiment, a method includes receiving, by a head node of a data storage system, a write request from a client of the data storage system; writing, by the head node, data included with the write request to a data storage of the head node; and requesting, by the head node, to write the data included with the write request to a plurality of mass storage devices in a plurality of data storage sleds of the data storage system. Requesting to write the data to the data storage sleds includes presenting respective credentials to respective sled controllers of each of the plurality of data storage sleds, wherein the respective sled controllers cause the data to be written to the respective mass storage devices of the respective data storage sleds in response to determining the respective credentials are valid credentials for accessing respective portions of the respective mass storage devices.

According to one embodiment, a method includes determining, by a sled controller of a data storage system, whether a credential included with a write request from a particular head node of the data storage system is a valid credential for accessing a particular portion of a particular mass storage device included in a sled with the sled controller. The method further includes in response to determining the credential is a valid credential for the particular portion of the particular mass storage device, causing the requested write to be performed on the particular portion of the particular mass storage device. The method also includes determining, by a sled controller of a data storage system, whether another credential included with another write request from another particular head node of the data storage system is a valid credential for accessing the particular portion of the particular mass storage device included in the sled with the sled controller; and in response to determining the other credential is an invalid credential for the particular portion of the particular mass storage device, declining to perform the requested write and returning a message to the other particular head node indicating the other credential for accessing the particular portion of the particular mass storage device is an invalid credential.

According to one embodiment, a data storage system comprises a plurality of head nodes, for example mounted on a rack, a plurality of data storage sleds, and at least two networking devices. The at least two networking devices are configured to implement at least two redundant networks within the data storage system, wherein to implement the at least two redundant networks each respective head node is coupled to each of the plurality of data storage sleds via a first one of the at least two networking devices, each respective head node is also coupled to each of the plurality of data storage sleds via a second one of the at least two networking devices, and each respective head node is assigned at least two unique network addresses for communicating with the plurality of data storage sleds. For example, a particular head node of a data storage unit may be configured to communicate with external devices via a first path through the first networking device and using a first address, such as a first IP address and also communicate with the external device via a redundant network path through the second networking device and using a second address, such as a second IP address. Also, a head node may be configured to communicate with mass storage devices in separate ones of the data storage sleds mounted in the rack via a first path through the first networking device and through a second path through the second networking device. In some embodiments, a data storage unit may be configured such that only a single network hop is required for a head node to retrieve data stored in data storage sleds of the data storage unit.

According to one embodiment, a data storage system includes a head node comprising at least three network interfaces, wherein at least two of the network interfaces are configured to implement at least two redundant networks within the data storage system and at least one network interface of the at least three network interfaces is configured to enable communications between the data storage system and external clients. To implement the at least two redundant networks the at least two network interfaces of the head node are configured to couple to each of a plurality of data storage sleds via a first networking device and couple to each of the plurality of data storage sleds via a second networking device. Also, the head node is assigned at least two unique network addresses for communicating with the plurality of data storage sleds.

According to one embodiment, a data storage system includes a data storage sled comprising at least two network interfaces configured to implement at least two redundant networks within the data storage system, wherein to implement the at least two redundant networks, the at least two network interfaces of the data storage sled are configured to couple to a particular head node via a first a networking device and couple to the same particular head node via a second networking device. Also, the data storage sled is assigned at least two unique network addresses for communicating with the particular head node or one or more additional head nodes of the data storage system.

Some data storage systems, such as storage area networks (SAN) may allow a server or a pair of servers to access a shared set of storage resources. However, such systems may be susceptible to significant losses in performance due to a server failure. Also, in such systems, data may be durably stored in storage devices of the SAN network, but not durably stored in the servers accessing the SAN network.

In order to provide high durability data storage and low latencies for accessing data, a data storage unit may store data in local storages of head nodes that function as servers for the data storage system, replicate the data to another head node of the data storage unit, and also store the data across multiple mass storage devices in multiple data storage sleds of the data storage unit. Thus, a data storage system that includes a data storage unit may provide low latency input/output operations for data stored in a storage of a head node, while still providing data durability due to the data being replicated to another head node. Furthermore, the data storage system may provide even higher durability for the data once the data is stored in multiple mass storage devices in different data storage sleds of the data storage unit. Thus, a data storage system may provide varying levels of data durability and input/output operation latency depending on whether the data is stored in a storage of a head node and replicated to another head node or whether the data is stored in multiple mass storage devices in different data storage sleds of the data storage system.

In some embodiments, data may be initially stored in a storage of a head node and replicated to a storage of another head node, and may be asynchronously moved to multiple mass storage devices in different data storage sleds that form a RAID array (random array of independent disks) to store the data. In some embodiments, recently stored data or frequently accessed data may remain in a head node storage to allow for low latency access to the data. The data may then be moved to mass storage devices in data storage sleds of a data storage unit of the data storage system after a certain amount of time has elapsed since the data was last accessed or stored. Moving the data to the mass storage devices may increase the durability of the data as compared to being stored in a storage of a primary head node and being replicated to a storage of a secondary head node. Thus a data storage system may provide different levels of durability and latency based on a staleness or a frequency of access to data stored in the data storage system. In some embodiments, other criteria may be used to determine when data stored in a storage of a head node is to be moved to mass storage devices of data storage sleds of a data storage unit. For example, data may be collected in a log of a head node and upon an amount of data being stored in the log exceeding a threshold amount, the data may be moved to mass storage devices of data storage sleds of a data storage unit of the data storage system.

In some embodiments, a data storage unit of a data storage system may multiple head nodes, multiple data storage sleds, and at least two networking devices. The data storage unit may further include connectors for coupling the data storage unit with at least two separate power sources. The data storage unit may also include at least two power distribution systems within the data storage unit to provide redundant power to the head nodes, the data storage sleds, and the networking devices of the data storage unit. Furthermore, the at least two networking devices of the data storage unit may implement at least two redundant networks within the data storage unit that enable communications between the head nodes of the data storage unit and the data storage sleds of the data storage unit. Furthermore, the at least two networking devices of the data storage unit may implement at least two redundant networks within the data storage unit that enable communications between the head nodes of the data storage unit and external clients of the data storage unit. In some embodiments, a data storage unit that include redundant networks and redundant power may provide high reliability and data durability for data storage and access while storing data locally within devices mounted within a single rack.

In some embodiments, a data storage unit of a data storage system may include multiple head nodes that are assigned network addresses that are routable from devices external to the data storage unit. Thus, external clients may communicate directly with head nodes of a data storage unit without the communications being routed through a control plane of the data storage system that is external to the data storage unit, such as a zonal control plane. Also, a data storage system that includes multiple data storage units may implement a zonal control plane that assigns volumes or volume partitions to particular ones of the data storage units of the data storage system. Also, a zonal control plane may coordinate operations between data storage units, such as rebalancing loads by moving volumes between data storage units. However, a data storage unit may also implement a local control plane configured to perform fail over operations for head nodes and mass storage devices of data storage sleds of the data storage unit. Because head nodes of a data storage unit may communicate directly with client devices and because a local control plane may manage fail over operations within a data storage unit, the data storage unit may operate autonomously without relying on a zonal control plane once a volume has been created on the data storage unit.

In some embodiments, in order to prevent corruption of data stored in mass storage devices of a data storage system, a data control plane may be at least partially implemented on a sled controller of a data storage sled of the data storage system. The data storage sled may include multiple mass storage devices serviced by the sled controller. Also, portions of respective mass storage devices of a particular data storage sled may be reserved for a particular volume serviced by a particular head node functioning as a primary head node for the particular volume. In order to reserve the portions for the particular volume or a volume partition of the particular volume, a sled controller of a data storage sled may provide a token to a head node requesting to reserve the portions. Once the portions are reserved for the particular volume by the head node acting as the primary head node, the head node while acting as a primary head node for the particular volume, may provide the token to the sled controller along with a write request when writing new data to the portions. The sled controller may verify the token and determine the head node is authorized to write to the portions. Also, the sled controller may be configured to prevent writes from head nodes that are not authorized to write to the particular portions of the mass storage devices of the data storage sled that includes the sled controller. The sled controller may refuse to perform a write request based on being presented an invalid token or based on a token not being included with a write request.

In some embodiments, a control plane such as a local control plane or a zonal control plane of a data storage system may issue unique sequence numbers to head nodes of the data storage system to indicate which head node is a primary head node for a particular volume or volume partition. A primary head node may present a sequence number issued from a control plane to respective ones of the sled controllers of respective ones of the data storage sleds to reserve, for a particular volume or volume partition, respective portions of mass storage devices serviced by the respective ones of the respective sled controllers. In response, the sled controllers may issue a token to the primary head node to be included with future write requests directed to the respective portions.

In order to facilitate a failover operation between a primary head node and a secondary head node, a control plane may issue new credentials, e.g. a new sequence number, to a head node assuming a role of primary head node for a volume or volume partition. The newly assigned primary head node may present the credentials, e.g. new sequence number, to respective sled controllers to receive respective tokens that supersede tokens previously used to a previous head node acting as a primary head node for a particular volume or volume partition that had data stored in portions of mass storage devices service by the sled controller. Thus, during a fail over event, a previous primary head node may be fenced off from portions of mass storage devices to prevent corruption of data stored on the mass storage devices during the failover event.

FIG. 1 illustrates a data storage unit comprising head nodes and data storage sleds, according to some embodiments. Data storage unit 100, which may be included in a data storage system, includes network switches 102 and 104, head nodes 106 and data storage sleds 134-144 on shelves 118. Each data storage sled 134-144 includes a sled controller 112 and mass storage devices 110. The head nodes 106, data storage sleds 134-144, and network switches 102 and 104 are mounted in rack 130. In some embodiments, networking devices, such as network switches 102 and 104, may be mounted in a position adjacent to and external from a rack of a data storage unit, such as rack 130 of data storage unit 100. A data storage unit may have redundant network connections to a network external to the data storage unit, such as network 128 that is connected to both network switch 102 and network switch 104. In some embodiments, components of a data storage unit, such as network switches 102 and 104, head nodes 106, and data storage sleds 134-144 may be connected to redundant power sources. For example, power connections 108 indicate power connections for network switches 102 and 104, head nodes 106, and data storage sleds 134-144. Note that power connections 108 are illustrated as a power symbol for simplicity of illustration, but may include various types of power connectors and power distribution systems. For example, power connectors of data storage unit components, such as head nodes and data storage sleds, may couple to dual power distribution systems within a data storage unit that receive power from dual power sources. In some embodiments, a data storage unit may include more than two redundant power distribution systems from more than two redundant power sources.

Each head node of a data storage unit, such as each of head nodes 106, may include a local data storage and multiple network interface cards. For example, a head node may include four network ports, wherein two network ports are used for internal communications with data storage sleds of a data storage unit, such as data storage sleds 134-144, and two of the network ports are used for external communications, for example via network 128. In some embodiments, each head node may be assigned two publicly routable network addresses that are routable from client devices in network 128 and may also be assigned two local network addresses that are local to a data storage unit and are routable for communications between the head node and data storage sleds of the data storage unit. Thus, a data storage unit, such as data storage unit 100, may include multiple redundant networks for communications within the data storage unit. In some embodiments, publicly routable network addresses may be used for internal communications between head nodes and data storage sleds and a head node may be assigned four publicly routable network addresses that are routable from client devices in network 128. The data storage unit may also include redundant power distribution throughout the data storage unit. These redundancies may reduce risks of data loss or downtime due to power or network failures. Because power and network failure risks are reduced via redundant power and network systems, volumes may be placed totally or at least partially within a single data storage unit while still meeting customer requirements for reliability and data durability.

Also, one or more head nodes of a data storage unit, such as one or more of head nodes 106, may function as a head node and additionally implement a local control plane for a data storage unit. In some embodiments, a local control plane may be implemented in a logical container separate from other control and storage elements of a head node. A local control plane of a data storage unit may select amongst any of the head nodes, such as any of head nodes 106, of the data storage unit when selecting a head node to designate as a primary head node for a volume or volume partition and may select amongst any of the remaining head nodes of the data storage unit when selecting a head node to designate as a secondary head node for the volume or volume partition. For example a first one of head nodes 106 may be designated as a primary head node for a volume or volume partition and any of the remaining head nodes 106 may be selected as a secondary head node for the volume or volume partition. In some embodiments, a given one of the head nodes 106 may be designated as a primary head node for a given volume or volume partition and may also be designated as a secondary head node for another volume or volume partition.

Additionally, any head node may be assigned or select columns of space on mass storage devices in any of the data storage sleds of a data storage unit for storing data for a particular volume or volume partition. For example, any of head nodes 106 may reserve columns of space in mass storage devices 110 in any of data storage sleds 134-144. However, any particular column of space of a mass storage device may only be assigned to a single volume or volume partition at a time.

Because multiple head nodes and multiple data storage sleds are available for selection, a failure of a particular head node or a failure of a mass storage device in a particular data storage sled may not significantly reduce durability of data stored in the data storage unit. This is because, upon failure of a head node, a local control plane may designate another head node of the data storage unit to function as secondary head node for a volume or volume partition. Thus, the volume is only without a secondary head node for a short period of time during which a new secondary head node is being designated and index data is being replicated from the primary head node to the secondary head node. Furthermore, when a head node of a data storage unit fails, other head nodes of the data storage unit may still be able to access data in all of the storage sleds of the data storage unit. This is because no single data storage sled is exclusively assigned to any particular head node, but instead columns of space on individual mass storage devices of the data storage sleds are assigned to particular head nodes for particular volumes or volume partitions. This arrangement greatly reduces the blast radius of a head node failure or a disk failure as compared to other storage systems in which each server has a dedicated set of storage devices.

As discussed in more detail below, in some embodiments, a head node or local control plane of a data storage unit may be configured to replicate data stored on mass storage devices that are located in a data storage sled to other mass storage devices in other data storage sleds. Thus, for example, when a data storage sled with a failed mass storage device is removed from a data storage unit for replacement or repair, data from one or more non-failed mass storage devices in a data storage sled may still be available because the data has been replicated to other data storage sleds of the data storage unit. For example, if a single mass storage device 110 in data storage sled 134 failed, data stored in the remaining mass storage devices 110 of data storage sled 134 may be replicated to mass storage devices 110 in any of data storage sleds 136-144. Thus while data storage sled 134 is removed from data storage unit 100 for repair or replacement of the failed mass storage device 110, data previously stored on the non-failed mass storage devices 110 of data storage sled 134 may still be available to head nodes 106.

Also, a data storage unit, such as data storage unit 100, may perform read and write operations independent of a zonal control plane. For example, each of head nodes 106 may be assigned one or more network addresses, such as IP addresses, that are advertised outside of data storage unit 100. Read and write requests may be routed to individual head nodes at the assigned network addresses of the individual head nodes via networking devices of the data storage unit, such as network switches 102 and 104, without the read and write requests being routed through a control plane external to the data storage unit, such as a control plane external to data storage unit 100.

In some embodiments, a data storage sled, such as one of data storage sleds 134-144, may include a sled controller, such as one of sled controllers 112. A sled controller may present the mass storage devices of the data storage sled to the head nodes as storage destination targets. For example head nodes and data storage sleds may be connected over an Ethernet network. In some embodiments, head nodes, such as head nodes 106 may communicate with mass storage devices 110 and vice versa via sled controllers 112 using a Non-volatile Memory Express (NVMe) protocol, or other suitable protocols. In some embodiments, each head node may be assigned multiple private network addresses for communication with data storage sleds over redundant internal Ethernet networks internal to a data storage unit. In some embodiments, a head node at an I/O processing software layer may perform a local disk operation to write or read from a mass storage device of a data storage sled and another software layer of the head node may encapsulate or convert the I/O operation into an Ethernet communication that goes through a networking device of the data storage unit to a sled controller in one of the data storage sleds of the data storage unit. A network interface of a head node may be connected to a slot on a motherboard of the head node, such as a PCIe slot, so that the mass storage devices of the data storage sleds appears to the operating system of the head node as a local drive, such as an NVMe drive. In some embodiments, a head node may run a Linux operating system or other type of operating system. The operating system may load standard drivers, such as NVMe drivers, without having to change the drivers to communicate with the mass storage devices mounted in the data storage sleds.

In some embodiments, a local control plane may be configured to designate more than one head node as a secondary/back-up head node for a volume or a volume partition and also adjust a number of mass storage devices that make up a RAID array for longer term storage of data for the data volume or volume partition. Thus if increased durability is desired for a particular volume or volume partition, the volume data may be replicated on "N" head nodes and subsequently stored across "M" mass storage devices in data storage sleds of the data storage unit, wherein the number "N" and the number "M" may be adjusted to achieve a particular level of durability. In some embodiments, such an arrangement may allow high levels of durability to be realized without having to store data for a data volume outside of a single data storage unit. Also, in such an arrangement, input/output operations may be performed more quickly because data for a particular volume is stored within a single data storage unit.

Also, a given head node may be designated as a primary head node or a secondary head node for multiple volumes. Furthermore, a zonal control plane of a data storage system or a local control plane of a data storage unit may balance volume placement across head nodes of a data storage unit. Because volumes are distributed amongst the head nodes, variations in peak IOPS to average IOPS may be reduced because while one volume may experience peak load other volumes serviced by a particular head node may experience less than peak IOPS load. In some embodiments, a zonal or local control plane may adjust head node designations or volume assignments to balance loads if volumes on a particular head node experience significantly more TOPS than volumes serviced by other head nodes.

While, FIG. 1 illustrates mass storage devices 110 as solid state drives, any suitable storage device may be used. For example, in some embodiments, storage devices 110 may include hard disk drives. Also, FIG. 1 illustrates networking devices 102 and 104 to be networking switches. However, in some embodiments, other suitable networking devices may be used such as routers, etc.

In some embodiments, a data storage unit, such as data storage unit 100, may be part of a larger provider network system. Also, in some embodiments more than one data storage unit may be included in a block storage service of a provider network. For example, FIG. 2 illustrates such an example provider network, according to some embodiments.

Figure 2:
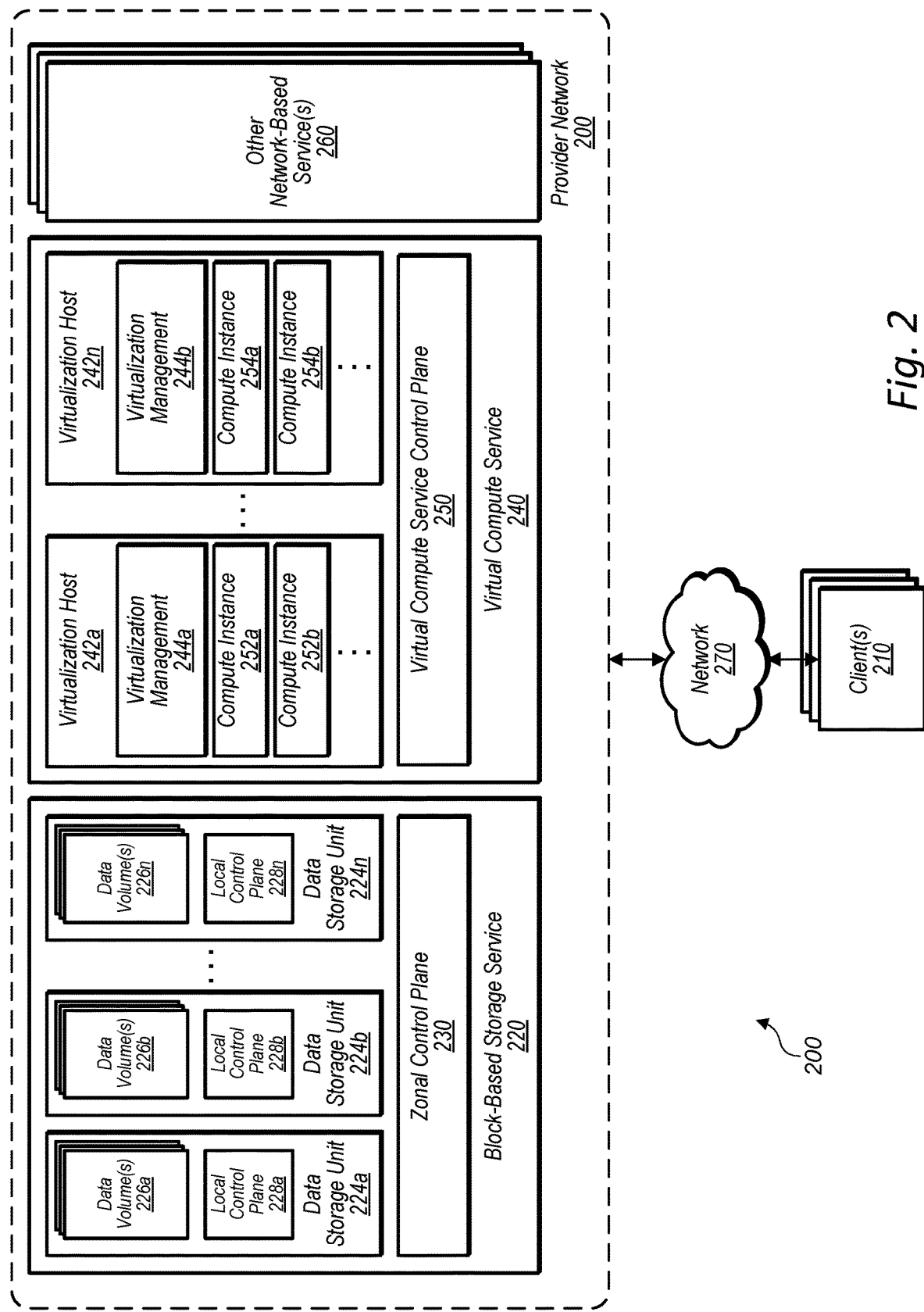
FIG. 2 is a block diagram illustrating a provider network implementing multiple network-based services including a block-based storage service that includes data storage units, according to some embodiments.

FIG. 2 is a block diagram illustrating a provider network that includes multiple network-based services such as a block-based storage service that implements dynamic resource creation to connect with client resources, according to some embodiments. Provider network 200 may be set up by an entity such as a company or a public sector organization to provide one or more services (such as various types of cloud-based computing or storage) accessible via the Internet and/or other networks to clients 210. Provider network 200 may include numerous data centers hosting various resource pools, such as collections of physical and/or virtualized computer servers, storage devices, networking equipment and the like (e.g., computing device 2100 described below with regard to FIG. 21), needed to implement and distribute the infrastructure and services offered by the provider network 200. In some embodiments, provider network 200 may provide computing resources, such as virtual compute service 240, storage services, such as block-based storage service 220, and/or any other type of network-based services 260. Clients 210 may access these various services offered by provider network 200 via network 270. Likewise network-based services may themselves communicate and/or make use of one another to provide different services. For example, computing resources offered to clients 210 in units called "instances," such as virtual or physical compute instances, may make use of particular data volumes 226, providing virtual block-based storage for the compute instances. Also, note that any of the data storage units 224a, 224b, 224n may be data storage units such as data storage unit 100 illustrated in FIG. 1.

As noted above, virtual compute service 240 may offer various compute instances, such as compute instances 254a and 254b to clients 210. A virtual compute instance may, for example, comprise one or more servers with a specified computational capacity (which may be specified by indicating the type and number of CPUs, the main memory size, and so on) and a specified software stack (e.g., a particular version of an operating system, which may in turn run on top of a hypervisor). A number of different types of computing devices may be used singly or in combination to implement the compute instances of virtual compute service 240 in different embodiments, including special purpose computer servers, storage devices, network devices and the like. In some embodiments instance clients 210 or any other user may be configured (and/or authorized) to direct network traffic to a compute instance. In various embodiments, compute instances may mount, connect, attach or map to one or more data volumes 226 provided by block-based storage service 220 in order to obtain persistent block-based storage for performing various operations.

Compute instances may operate or implement a variety of different platforms, such as application server instances, Java™ virtual machines (JVMs), special-purpose operating systems, platforms that support various interpreted or compiled programming languages such as Ruby, Perl, Python, C, C++ and the like, or high-performance computing platforms) suitable for performing client applications, without for example requiring the client 210 to access an instance.

Compute instance configurations may also include compute instances with a general or specific purpose, such as computational workloads for compute intensive applications (e.g., high-traffic web applications, ad serving, batch processing, video encoding, distributed analytics, high-energy physics, genome analysis, and computational fluid dynamics), graphics intensive workloads (e.g., game streaming, 3D application streaming, server-side graphics workloads, rendering, financial modeling, and engineering design), memory intensive workloads (e.g., high performance databases, distributed memory caches, in-memory analytics, genome assembly and analysis), and storage optimized workloads (e.g., data warehousing and cluster file systems). Size of compute instances, such as a particular number of virtual CPU cores, memory, cache, storage, as well as any other performance characteristic. Configurations of compute instances may also include their location, in a particular data center, availability zone, geographic, location, etc., and (in the case of reserved compute instances) reservation term length.

As illustrated in FIG. 2, a virtualization host, such as virtualization hosts 242a and 242n, may implement and/or manage multiple compute instances 252a, 252b, 254a, and 254b respectively, in some embodiments, and may be one or more computing devices, such as computing device 2100 described below with regard to FIG. 21. Virtualization hosts 242 may also provide multi-tenant hosting of compute instances. For example, in some embodiments, one virtualization host may host a compute instance for one entity (e.g., a particular client or account of virtual computing service 210), while another compute instance hosted at the same virtualization host may be hosted for another entity (e.g., a different account). A virtualization host may include a virtualization management module, such as virtualization management modules 244*a* and 244*b* capable of instantiating and managing a number of different client-accessible virtual machines or compute instances. The virtualization management module may include, for example, a hypervisor and an administrative instance of an operating system, which may be termed a "domain-zero" or "dom0" operating system in some implementations. The dom0 operating system may not be accessible by clients on whose behalf the compute instances run, but may instead be responsible for various administrative or control-plane operations of the network provider, including handling the network traffic directed to or from the compute instances.

Virtual computing service 240 may implement control plane 250 to perform various management operations. For instance, control plane 250 may implement resource management to place compute instances, and manage the access to, capacity of, mappings to, and other control or direction of compute instances offered by provider network. Control plane 250 may also offer and/or implement a flexible set of resource reservation, control and access interfaces for clients 210 via an interface (e.g., API). For example, control plane 250 may provide credentials or permissions to clients 210 such that compute instance control operations/interactions between clients and in-use computing resources may be performed.

In various embodiments, control plane 250 may track the consumption of various computing instances consumed for different virtual computer resources, clients, user accounts, and/or specific instances. In at least some embodiments, control plane 250 may implement various administrative actions to stop, heal, manage, or otherwise respond to various different scenarios in the fleet of virtualization hosts 242 and instances 252, 254. Control plane 250 may also provide access to various metric data for client(s) 210 as well as manage client configured alarms.

In various embodiments, provider network 200 may also implement block-based storage service 220 for performing storage operations. Block-based storage service 220 is a storage system, composed of one or more computing devices implementing a zonal control plane 230 and a pool of multiple data storage units 224*a*, 224*b* through 224*n* (e.g., data storage units such as data storage unit 100 illustrated in FIG. 1), which provide block level storage for storing one or more sets of data volume(s) 226*a*, 226*b* through 226*n*. Data volumes 226 may be attached, mounted, mapped, or otherwise connected to particular clients (e.g., a virtual compute instance of virtual compute service 240), providing virtual block-based storage (e.g., hard disk storage or other persistent storage) as a contiguous set of logical blocks. In some embodiments, a data volume 226 may be divided up into multiple data chunks or partitions (including one or more data blocks) for performing other block storage operations, such as snapshot operations or replication operations. A volume snapshot of a data volume 226 may be a fixed point-in-time representation of the state of the data volume 226. In some embodiments, volume snapshots may be stored remotely from a data storage unit 224 maintaining a data volume, such as in another storage service 260. Snapshot operations may be performed to send, copy, and/or otherwise preserve the snapshot of a given data volume in another storage location, such as a remote snapshot data store in other storage service 260. In some embodiments, a block-based storage service, such as block-based storage service 220, may store snapshots of data volumes stored in the block-based storage service.

Block-based storage service 220 may implement zonal control plane 230 to assist in the operation of block-based storage service 220. In various embodiments, zonal control plane 230 assists in creating volumes on data storage units 224*a*, 224*b*, through 224*n* and moving volumes between data storage units 224*a*, 224*b*, through 224*n*. In some embodiments, access to data volumes 226 may be provided over an internal network within provider network 200 or externally via network 270, in response to block data transaction instructions.

Zonal control plane 230 may provide a variety of services related to providing block level storage functionality, including the management of user accounts (e.g., creation, deletion, billing, collection of payment, etc.). Zonal control plane 230 may implement capacity management, which may generate and manage a capacity model for storage service 220, and may direct the creation of new volumes on particular data storage units based on the capacity of storage service 220. Zonal control plane 230 may further provide services related to the creation and deletion of data volumes 226 in response to configuration requests.

Clients 210 may encompass any type of client configured to submit requests to network provider 200. For example, a given client 210 may include a suitable version of a web browser, or may include a plug-in module or other type of code module configured to execute as an extension to or within an execution environment provided by a web browser. Alternatively, a client 210 may encompass an application such as a database application (or user interface thereof), a media application, an office application or any other application that may make use of compute instances, a data volume 226, or other network-based service in provider network 200 to perform various operations. In some embodiments, such an application may include sufficient protocol support (e.g., for a suitable version of Hypertext Transfer Protocol (HTTP)) for generating and processing network-based services requests without necessarily implementing full browser support for all types of network-based data. In some embodiments, clients 210 may be configured to generate network-based services requests according to a Representational State Transfer (REST)-style network-based services architecture, a document- or message-based network-based services architecture, or another suitable network-based services architecture. In some embodiments, a client 210 (e.g., a computational client) may be configured to provide access to a compute instance or data volume 226 in a manner that is transparent to applications implemented on the client 210 utilizing computational resources provided by the compute instance or block storage provided by the data volume 226.

Clients 210 may convey network-based services requests to provider network 200 via external network 270. In various embodiments, external network 270 may encompass any suitable combination of networking hardware and protocols necessary to establish network-based communications between clients 210 and provider network 200. For example, a network 270 may generally encompass the various telecommunications networks and service providers that collectively implement the Internet. A network 270 may also include private networks such as local area networks (LANs) or wide area networks (WANs) as well as public or private wireless networks. For example, both a given client 210 and provider network 200 may be respectively provisioned within enterprises having their own internal networks. In such an embodiment, a network 270 may include the hardware (e.g., modems, routers, switches, load balancers, proxy servers, etc.) and software (e.g., protocol stacks, accounting software, firewall/security software, etc.) necessary to establish a networking link between given client 210 and the Internet as well as between the Internet and provider network 200. It is noted that in some embodiments, clients 210 may communicate with provider network 200 using a private network rather than the public Internet.

Data Replication

Figure 3:
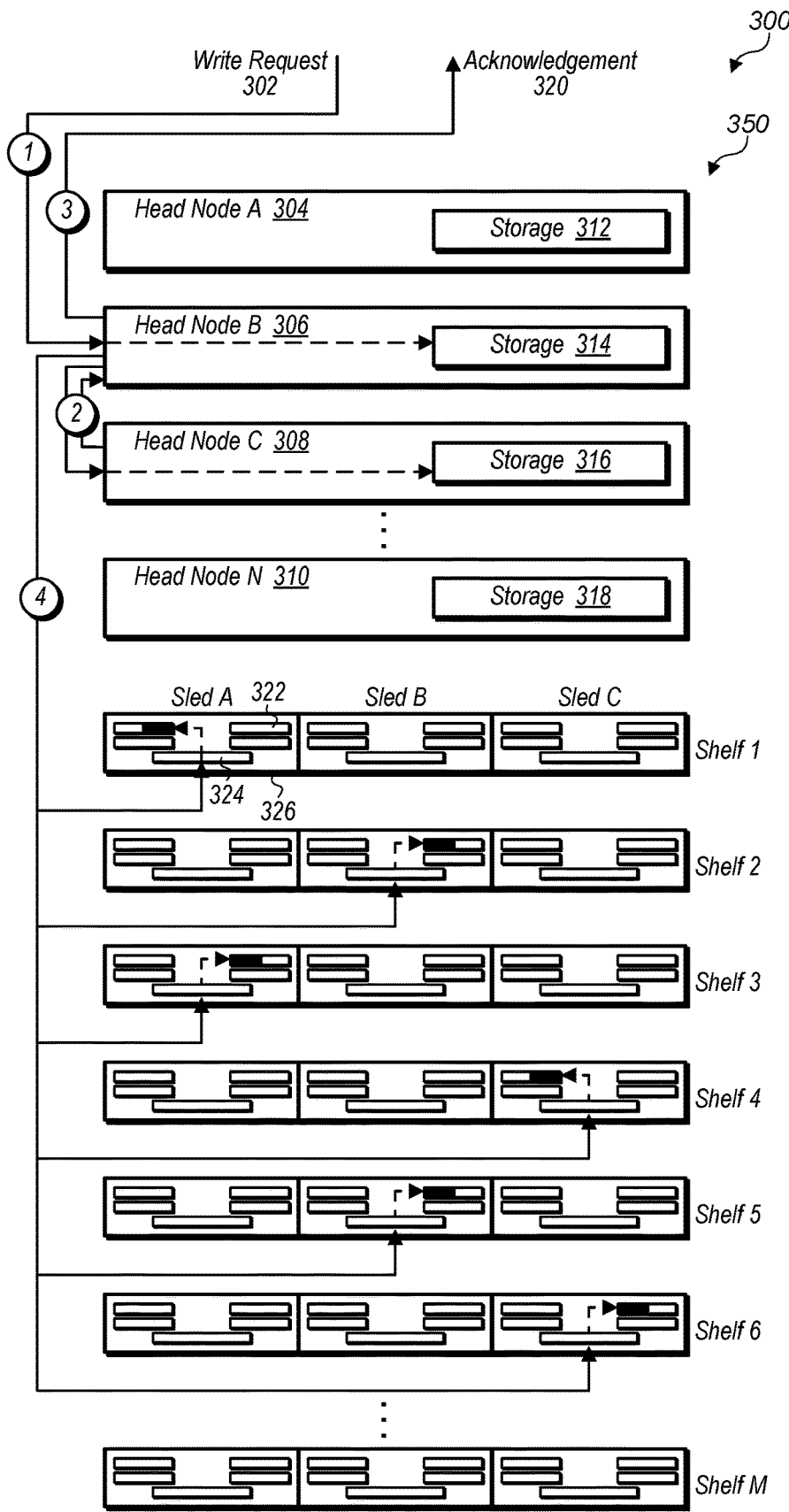
FIG. 3 is a block diagram illustrating head nodes and data storage sleds of a data storage unit storing block storage data in response to a write request, according to some embodiments.

FIG. 3 is a block diagram illustrating head nodes and data storage sleds of a data storage unit storing block storage data in response to a write request, according to some embodiments. Head nodes 306 illustrated in FIG. 3 may be the same as head nodes 106 illustrated in FIG. 1. Also, data storage sleds 326 may be the same as data storage sleds 134-144 illustrated in FIG. 1.

As discussed above, a data storage system that includes a data storage unit, may store volume data in a data storage of a first head node designated as a primary head node for a volume or volume partition and may also replicate the volume data to a second head node designated as a secondary head node for the volume or volume partition. For example, at time 1, a write request 302 is routed to head node 306 that is designated as a primary head node for a volume or volume partition. At time 2 subsequent to the write request being received at head node 306, data included with the write request is stored in storage 314 of primary head node 306 and primary head node 306 causes the data included with the write request to be replicated to storage 316 of secondary head node 308. Replication of the data to secondary head node 306 is performed concurrently or nearly concurrently with storing the data in storage 314 of primary head node 306. Also, as shown in FIG. 3 at time 2, replication of the data to the secondary head node may include the secondary head node sending an acknowledgment back to the primary head node indicating that the data has been replicated to the secondary head node. Subsequently at time 3, which is also nearly concurrent with the data being stored in the storage of the primary head node and the data being replicated to the secondary head node, the primary head node, head node 306, may issue an acknowledgement 320 to the client device that requested write 302 has been committed in data storage system 300.

In some embodiments, a write request, such as write request 302, may be concurrently received at a primary head node and a secondary head node. In such embodiments, the primary head node may verify that the secondary head node has committed the write before acknowledging at time 3 that the write has been committed in the data storage system.

At a later point in time 4, e.g. asynchronous to times 1-3, the primary head node, e.g. head node 306, may cause data stored in storage 314, that includes the data included with the write request and that may include additional data stored before or after the write request, to be flushed to mass storage devices 322 of the data storage sleds 326 of the data storage unit. For example, at time 4 data is flushed to mass storage devices 322 of data storage sleds 326. In some embodiments, data is divided into portions and stored across multiple mass storage devices, each in a different sled and/or on a different shelf of a data storage unit. In some embodiments, data is also erasure encoded when stored in mass storage devices of data storage sleds. For example, data flushed from storage 314 of head node 306 may be divided into six portions where each portion is stored in a different mass storage device of a different data storage sled on a different shelf of a data storage unit 350 of data storage system 300 and is also erasure encoded across the different mass storage devices. For example data portions are stored in sled A of shelf 1, sled B of shelf 2, sled A of shelf 3, sled C of shelf 4, sled B of shelf 5, and sled C of shelf 6.

Also, as can be seen in FIG. 3, a data storage unit, such as data storage unit 350, may include "M" number of shelves and "N" number of head nodes. The portions of data may be stored on portions of mass storage devices 322 in the respective data storage sleds 326. In order to distinguish between a portion of data and a portion of space on a mass storage device, a portion of space on a mass storage device may be referred to herein as a "column" of a mass storage device. Furthermore, a set of columns of mass storage devices that store different portions of data of a volume such as the columns shown in sled A of shelf 1, sled B of shelf 2, sled A of shelf 3, sled C of shelf 4, sled B of shelf 5, and sled C of shelf 6 may collectively make up what is referred to herein as an "extent." For example, in an erasure encoded RAID six array, an extent may include six columns that collectively make up the RAID array. Four of the columns may store striped data and two of the columns may store parity data. In some embodiments, other replication algorithms other than erasure encoding may be used such as quorum algorithms, etc.

In some embodiments, each column of an extent may be in a different fault domain of a data storage unit. For example, for the extent being stored in FIG. 3 each column is located in a different data storage sled that is mounted on a different shelf of the data storage unit 350. Thus a failure of a sled controller, such as one of sled controllers 324, may only affect a single column. Also if a power supply of a data storage sled fails it may only affect a single data storage sled or if a part of a power distribution system fails it may affect a single shelf. However, because each column of an extent may be located in a different shelf, a shelf level power event may only affect a single column of the extent.

In some embodiments, a head node of a data storage unit, such as one of head nodes 304, 306, 308, or 310, may implement a local control plane. The local control plane may further implement an extent allocation service that allocates extents to head nodes designated as a primary head node for a volume or volume partition. In some embodiments, an extent allocation service may allocate a set of extents to a particular volume referred to herein as a "sandbox." The primary head node for the particular volume may then select extents to store data on during a data flush from the primary head node to data storage sleds of the data storage unit by selecting an extent from the sandbox allocated for the particular volume.

In some embodiments, if insufficient space is available in the particular volume's sandbox or if a particular placement would cause a data durability of data to be saved to fall below a minimum required durability for the particular volume, a primary head node for the particular volume may select columns outside of the particular volume's sandbox to write data for the particular volume. For example, a sandbox may include multiple columns that make up multiple extents in different ones of the data storage sleds 326 on different ones of the shelves of a data storage unit 350. A primary head node may be able to flush data to columns within a particular volume's sandbox without having to request extent allocation from a local control plane that implements an extent allocation service. This may further add durability and reliability to a data storage unit because a primary head node for the particular volume may continue to flush data even if communication is lost with a local control plane within the data storage unit. However, if space is not available or a placement would cause durability for a particular volume or volume partition to fall below a minimum threshold, a primary head node may flush data to columns outside of the particular volume's sandbox. In some embodiments, a primary head for a particular volume may flush data to columns outside the primary head node's sandbox without requesting an allocation from a local control plane that implements an extent allocation service. For example, a primary head node may store addresses for each sled controller in a data storage unit and may flush data to any sled controller in the data storage unit that is associated with mass storage devices with available columns.

As will be discussed in more detail in regard to FIG. 15, a sled controller of a data storage sled, such as sled controller 324, may implement a fencing protocol that prevents a primary head node from writing to columns for which another primary head node has assumed control after the primary head node has been superseded by another head node assuming the role of primary head node for a particular volume or volume partition. It should be pointed out that a secondary head node or other back-up head nodes may not flush data to data storage sleds and flushing may be limited to only being performed by a primary head node.

Because for a particular volume, the volume's data may be stored in a storage of a primary head node and replicated to a secondary head node and may later be moved to being stored across an extent of mass storage devices in different data storage sleds of a data storage unit, an index with pointers to where the data is stored may be used for subsequent read requests and write requests to locate the data. Also in some embodiments, storages of a head node may be log-structured such that incoming write request are written to the head of the log of the head node's log-structured storage. An index entry may be added indicating where the written data is stored in the head node's log and subsequently the index may be updated when the written data is flushed from the log of the primary head node to an extent comprising columns of mass storage devices of the data storage system.

Figure 4A:
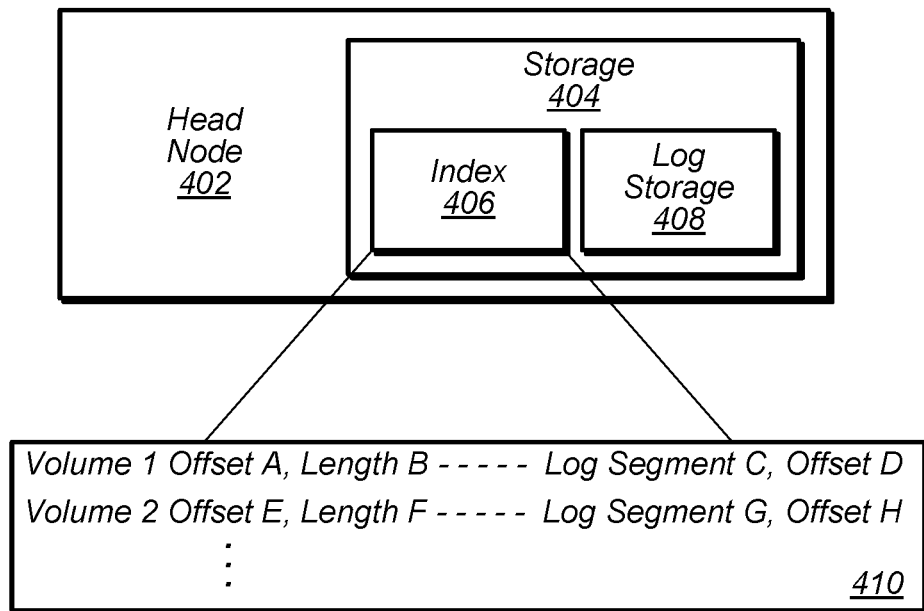
FIGS. 4A-4B are block diagrams illustrating a log storage and index of a head node storage, according to some embodiments.
Figure 4B:
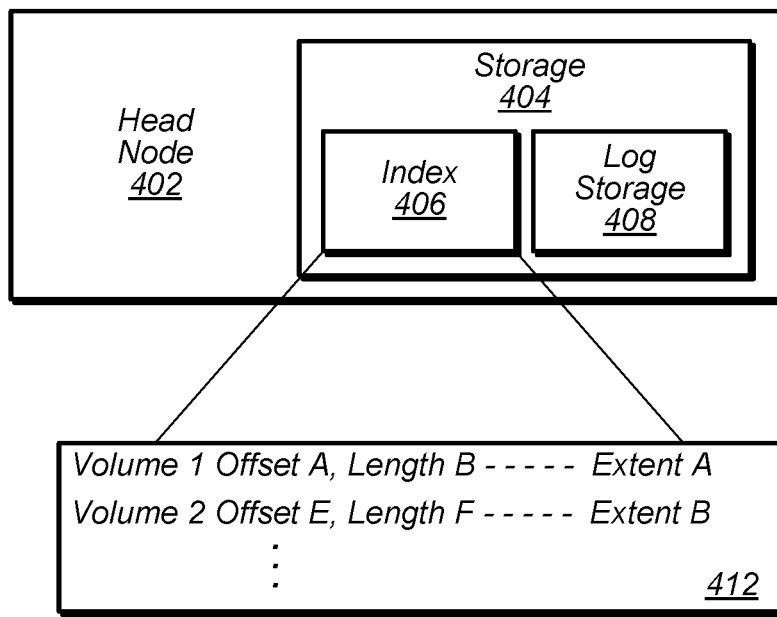

FIGS. 4A-4B are block diagrams illustrating a log-structured storage and an index of a head node storage, according to some embodiments. Head node 402 includes storage 404 that includes log 408 and index 406. Volume data may be stored in log 408 prior to being flushed to mass storage devices of a data storage unit. Index information 410 may include an entry for the volume data and a corresponding pointer to where the volume data is stored. For example, index information 410 indicates that data for volume 1, offset A, length B is stored in log storage 408 at log segment C and offset D. In some embodiments, a log of a head node such as log 408 of storage 404 of head node 402 may store data for more than one volume. For example, index information 410 also includes an entry for volume 2 offset E, length F and a corresponding pointer indicating the data for this volume entry is stored in log 408 at log segment G, offset H.

While FIGS. 4A-B illustrate log storage 408 and index 406 as separate from each other, in some embodiments, an index, such as index 406, may lay on top of a log or side-by-side with a log, such as log storage 408.

When data for a volume is moved from a storage of a head node to being stored in an extent across multiple mass storage devices of a data storage unit, the data for the volume may be removed from a log of a head node storage and an index of the head node storage may be updated to indicate the new location at which the data for the volume is stored. For example, in FIG. 4B, index information 412 indicates that data for volume 1, offset A, length B is now stored at extent A and data for volume 2, offset E, length F is now stored at extent B. Note that the labels "extent A" and "extent B" are used for ease of illustration. In some embodiments, an index may include addresses of data storage sleds where the data for the volume is located, such as local IP addresses of the data storage sleds, and addresses of the columns of the mass storage devices within the data storage sleds. In some embodiments, an index may include another label such as "extent A" where each head node stores information for locating "extent A" or may consult an extent allocation service for locating "extent A." In some embodiments, an index may include addresses of data storage sleds where the data for the volume is located and sled controllers of the data storage sleds may be able to determine the appropriate columns based on volume IDs stored in respective columns allocated to the volume.

When a read request is received by a head node designated as a primary head node for a volume, the head node may consult an index of a storage of the head node, such as index 406 of storage 404, to determine what is the latest version of the volume's data and where the latest version of the volume's data is stored. For example a primary head node, such as head node 402, may consult the primary head node's index, such as index 406, to determine if the latest version of the volume's data is stored in the head node's log, such as log 408, or is stored in an extent comprising mass storage devices of the data storage unit.

Figure 5:
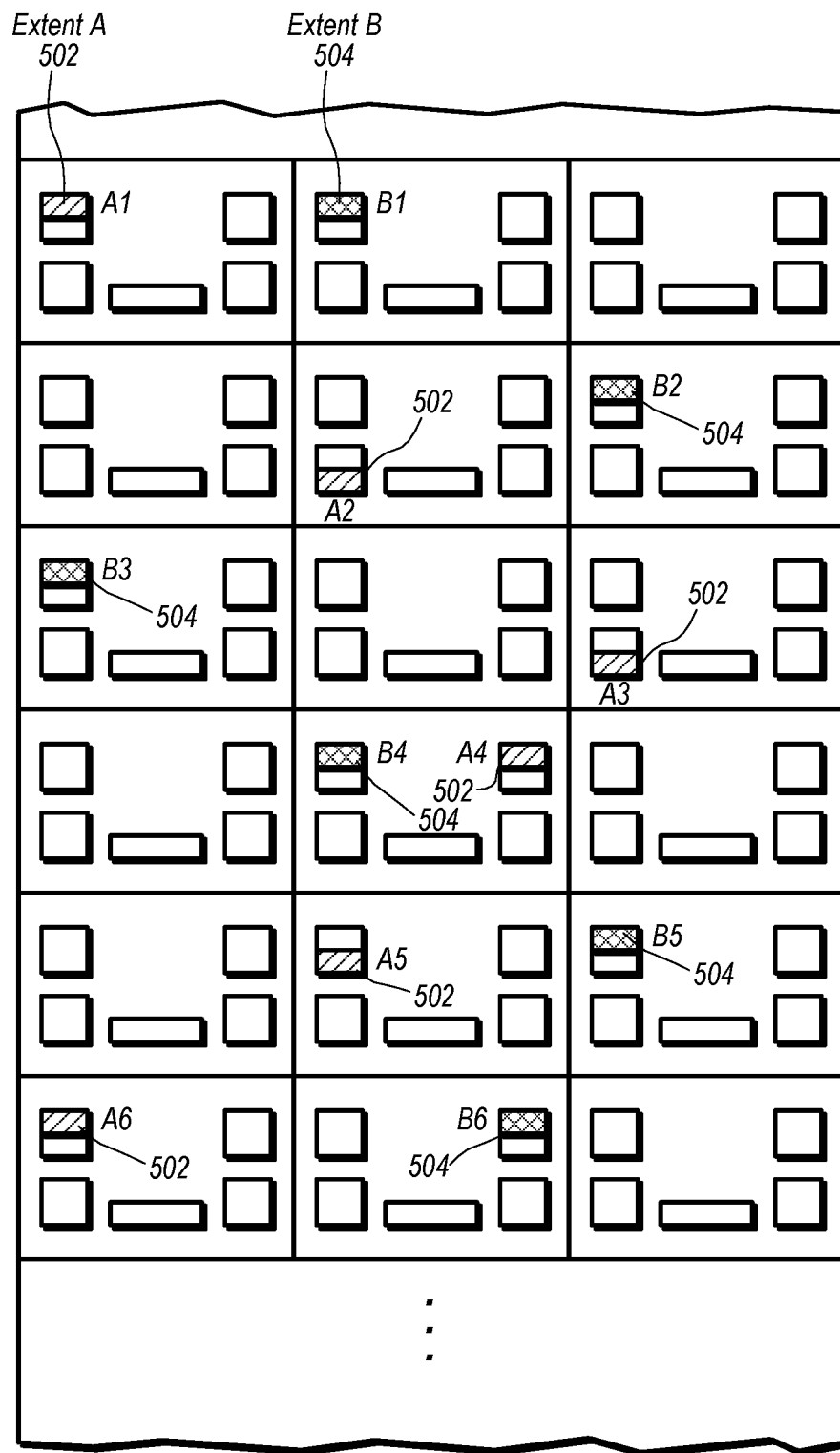
FIG. 5 illustrates a partial view of a data storage unit that stores portions of a volume partition in multiple mass storage devices in multiple data storage sleds on multiple shelves of the data storage unit, according to some embodiments.

FIG. 5 illustrates a partial view of a data storage unit that stores portions of a volume partition in multiple mass storage devices in multiple data storage sleds on multiple shelves of the data storage unit, according to some embodiments. FIG. 5 illustrates an example storage pattern for extent A from index 406 in FIG. 4B. Extent A from index 406 illustrated in FIG. 4B is shown as extent A 502 in FIG. 5 Also, an example storage pattern for extent B from index 406 illustrated in FIG. 4B is shown in FIG. 5 as extent B 504. Note that a data storage sled may include multiple columns of multiple extents. Also, in some embodiments a single mass storage device may include multiple columns of multiple extents.

Figure 6A:
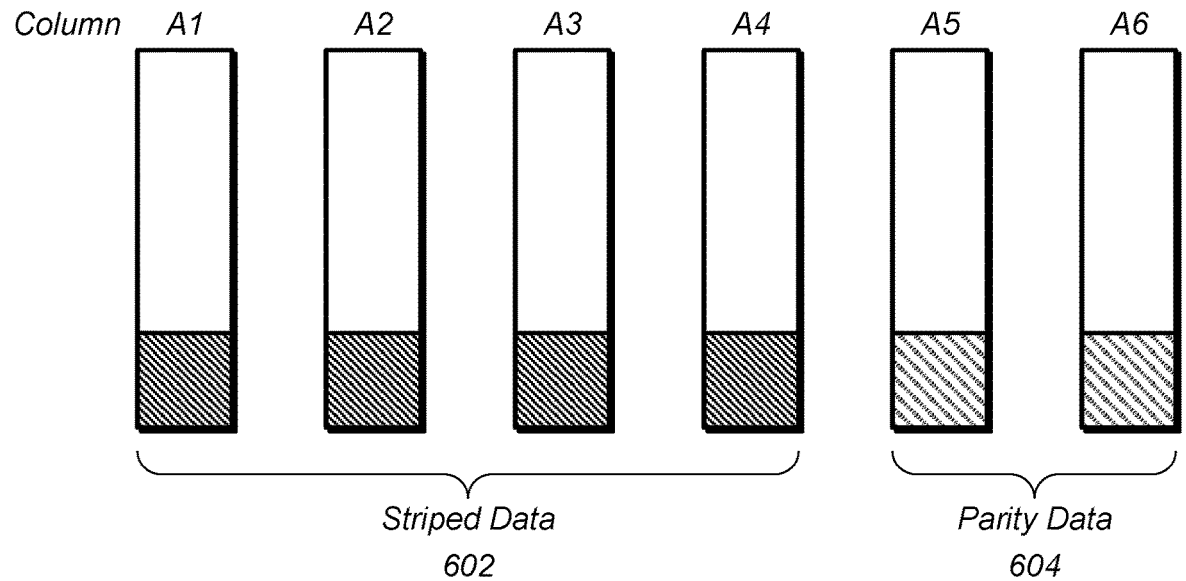
FIGS. 6A-B illustrate columns of mass storage devices storing different portions of a volume partition, according to some embodiments.
Figure 6B:
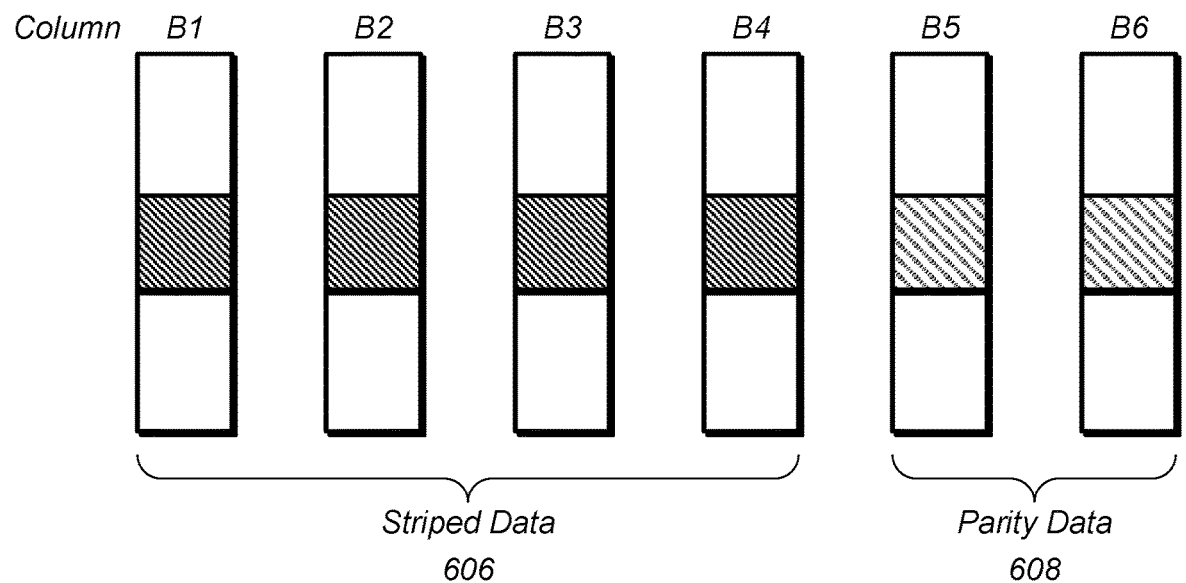

FIGS. 6A-B illustrate columns of mass storage devices storing different portions of a volume partition, according to some embodiments. FIG. 6A illustrates an embodiment in which data flushed to extent A, which may be the same extent A as described in FIGS. 4 and 5, is erasure encoded across 4+2 columns. The striped data 602 may include the original data flushed from log 408 divided into multiple portions and the parity data 604 may include encoded data that allows the flushed data to be recreated in case of failure of one or more of the mass storage devices or sleds that include one of the columns. FIG. 6B illustrates a similar embodiment where extent B is erasure encoded across four striped data columns 606 and two parity columns 608. Note that in FIG. 6B the data is stored in a different location in the column than is shown in FIG. 6A. This is intended to illustrate that the columns shown in FIG. 6B may already store data previously written to the columns of extent B, whereas the data being written to extent A may be the first set of data written to extent A. Also, it is worth noting that for a particular volume, multiple extents may be assigned to store data of the volume. In some embodiments, an extent may represent a fixed amount of storage space across a set number of columns of mass storage devices. When an extent is filled for a particular volume, another extent may be allocated to the volume by a head node or an extent allocation service. FIGS. 6A and 6B illustrate an example RAID level and erasure encoding technique. However, in some embodiments various other RAID levels may be used and various data coding techniques may be used to increase durability of stored data. It also worth noting that erasure encoding data may reduce a number of columns needed to achieve a particular level of durability. For example, data stored that is not erasure encoded may require the data to be stored redundantly across 8 columns to achieve a given level of durability, whereas a similar level of durability may be achieved by erasure encoding the data across fewer columns. Thus erasure encoding data may significantly reduce an amount of storage resources that are needed to store data to a particular level of durability. For example, data erasure encoded according to a 4+2 erasure coding scheme may be recreated from any four of the six columns, wherein the six columns include four columns of striped data segments and two columns of parity data segments.

In some embodiments, a data storage system may implement one or more communication protocols between head nodes and data storage sleds of the data storage system that allow for rapid communications between the head nodes and the data storage sleds. Thus, high levels of performance may be provided to clients of a data storage system despite volume data being erasure encoded across multiple columns of mass storage devices in different data storage sleds. For example, a data storage system may implement a protocol for reliable out-of-order transmission of packets as described in U.S. patent application Ser. No. 14/983,436 filed on Dec. 29, 2015, which is herein incorporated by reference. Also, for example, a data storage system may implement a protocol for establishing communication between a user application and a target application wherein the network does not require an explicit connection between the user application and the target application as described in U.S. patent application Ser. No. 14/983,431 filed on Dec. 29, 2015, which is herein incorporated by reference. In some embodiments, implementation of such protocols may permit data erasure encoded across multiple mass storage devices in multiple different data storage sleds to be read by a head node in a timely manner such that, from a perspective of a client device of the data storage system, performance is comparable to a system that does not erasure encode volume data across multiple mass storage devices or such that performance exceeds a performance of a system that does not erasure encode volume data across multiple mass storage devices.

Figure 7:
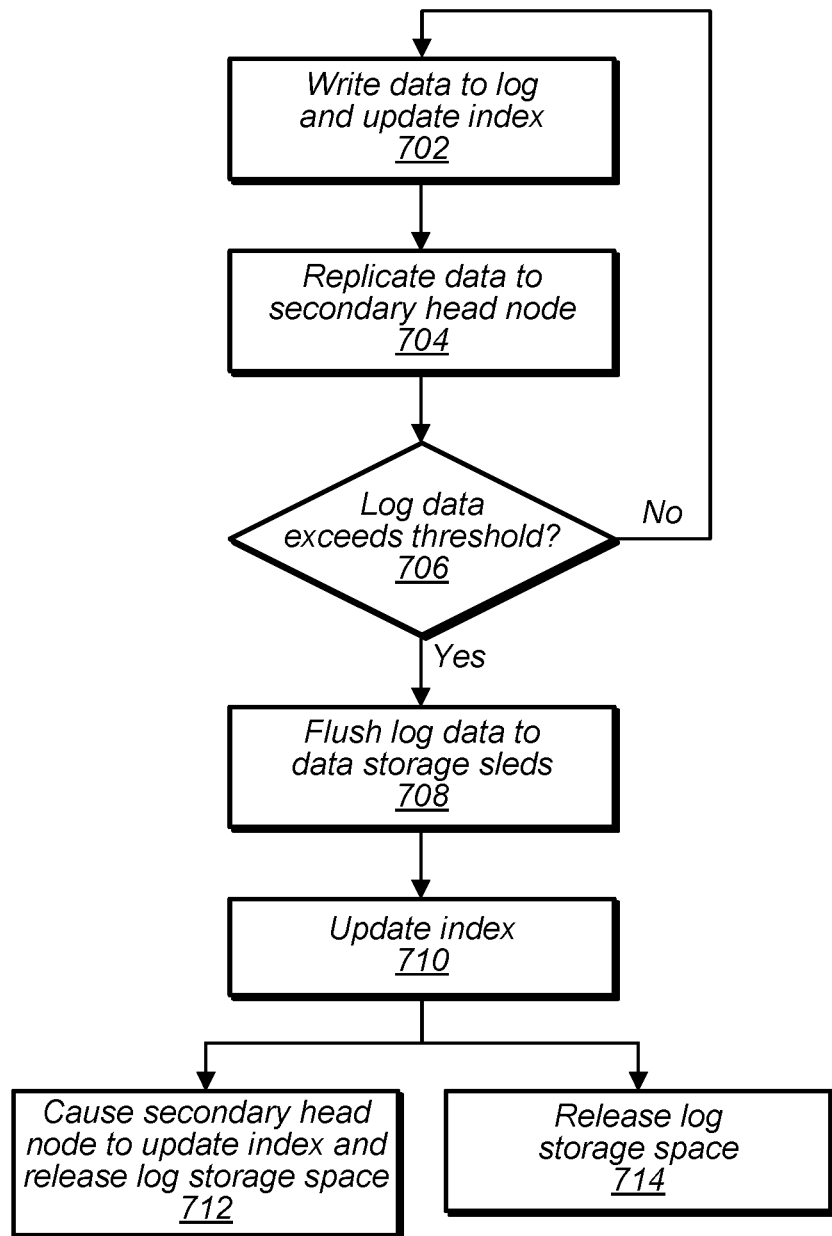
FIG. 7 is a high-level flowchart illustrating operations performed by a head node in response to a request to store data in a data storage unit, according to some embodiments.

FIG. 7 is a high-level flowchart illustrating operations performed by a head node in response to a request to store data in a data storage unit, according to some embodiments.

At 702, upon receiving a write request from a client device, wherein the write request is directed to a particular volume for which the head node is functioning as a primary head node, the head node writes data included with the write request to the log of the head node and updates the index of the head node to include an entry for the volume data and a pointer indicating where the volume data is stored.

At 704, the primary head node causes the data included with the write request to be replicated to the secondary head node. The secondary head node then stores the data in a log of the secondary head node and updates an index of a storage of the secondary head node to include an entry for the volume data and a pointer indicating where the volume data is stored. The secondary head node may then send an acknowledgement to the primary head node indicating that the data has been replicated in the secondary head node's storage. In some embodiments, the primary head node then issues an acknowledgement to the client device indicating that the requested write has been persisted in the data storage system. In some embodiments, replication between head nodes could be primary and secondary e.g. master/slave replication. In some embodiments, other replication techniques such as a Paxos protocol, other consensus protocol, etc. may be used to replicate data between head nodes.

At 706, the primary head node determines if the log data of the primary head node exceeds a threshold that would trigger the log data or a segment of the primary head node's log data to be flushed to extents that include columns of mass storage devices of data storage sleds of a data storage unit that includes the head node. In some embodiments, a threshold to trigger data to be flushed may include: an amount of data stored in the log or in a segment of the log, an amount of time that has elapsed since the data was last accessed or altered, a frequency at which the data is accessed or altered, or other suitable thresholds. In some embodiments, data flushed from a log of a head node may only include a portion of the data written to the log of the head node or a segment of the log of the head node. For example, older data stored in a log of a head node may be flushed while more recently written data may remain in the log of the head node. In some embodiments, a frequency of flush operations from a log of a head node may be throttled based on a variety of factors, such as a fill rate of the log of the head node or based on an amount of write requests being received by the head node or being received for a particular volume serviced by the head node.

In response to determining the threshold has not been met, the primary head node continues to write data to the log and reverts to 702.

At 708, in response to determining that the threshold has been met or exceeded, the primary head node causes data stored in the log of the primary head node or a segment of the log of the primary head node to be flushed to columns of mass storage devices in different ones of a plurality of data storage sleds of the data storage unit.

At 710, the primary head node updates the log of the primary head node to include a pointer for the volume data indicating that the flushed volume data is now stored in particular columns of mass storage devices or an extent that includes multiple columns of mass storage devices.

At 712, the primary head node causes the secondary head node to update an index of the secondary head node to indicate the new location of the volume data. The secondary head node also releases the log space in the secondary head node that previously stored the replicated volume data.

At 714, the head node acting as primary head node also releases space in the primary head node's log. In some embodiments, a garbage collection mechanism may cause log space to be released based on inspecting an index of a storage of a head node. In some embodiments, releasing log storage space may be performed concurrently with flushing log data or may be performed at some time subsequent to flushing log data.

Figure 8A:
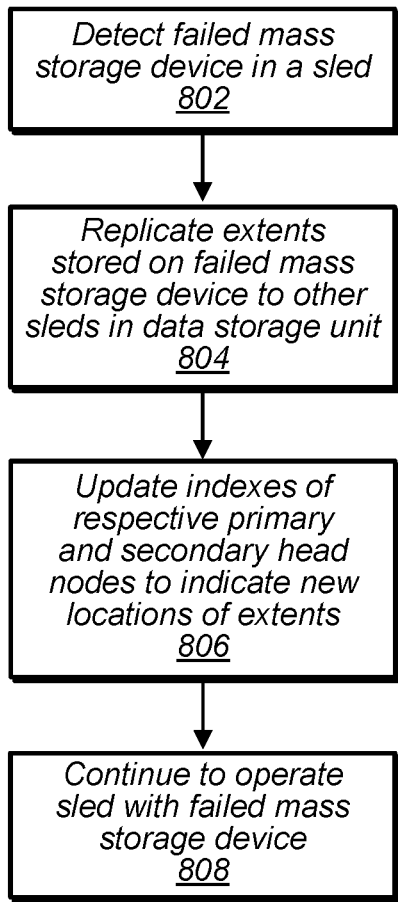
FIG. 8A is a high-level flowchart illustrating operations performed by a head node in response to a failed mass storage device in a data storage sled of a data storage unit, according to some embodiments.

FIG. 8A is a high-level flowchart illustrating operations performed by a head node in response to a failed mass storage device in a data storage sled of a data storage unit, according to some embodiments.

At 802, a head node or a sled controller detects a failed mass storage device in a particular data storage sled. For example, a data storage sled may include multiple mass storage devices, such as solid state storage drives, and one of the mass storage devices may fail. In some embodiments, a data storage sled may include disk drives and one of the disk drives may fail. In some embodiments, a data storage sled may include other types of mass storage devices.

At 804, a head node acting as a primary head node for a volume with extents that include one or more columns on the failed mass storage device or a local control plane for the data storage unit causes the extents that include columns on the failed mass storage device to be replicated to other extents that include columns on other mass storage devices in other sleds of the data storage unit. For example, in a 4+2 erasure coding scheme data from any one lost mass storage drive can be recreated based on data stored on the other mass storage devices that make up an extent. Thus, data previously stored on the failed mass storage device can be recreated and replicated to data storage sleds that do not include a failed mass storage device.

At 806, indexes of a primary head node and a secondary head node that are designated for each volume that included an extent in the failed mass storage device are updated to indicate the new locations of the data for the volumes.

In some embodiments, a data storage system may continue to operate a data storage sled that includes a failed mass storage device, such as the failed mass storage device at 808. In some embodiments, step 806 may be omitted and all extents stored on mass storage devices in the data storage sled that includes the failed mass storage device may be replicated to other data storage sleds. Because the extents that include columns on the failed mass storage device have been replicated to data storage sleds that do not include failed mass storage devices, the durability of the data previously stored on the failed mass storage device has been recovered to the original level of durability. For example in a RAID configuration of six segments, the number of segments is returned to six by replicating the data from the failed mass storage device to other mass storage devices in the data storage unit.

Figure 8B:
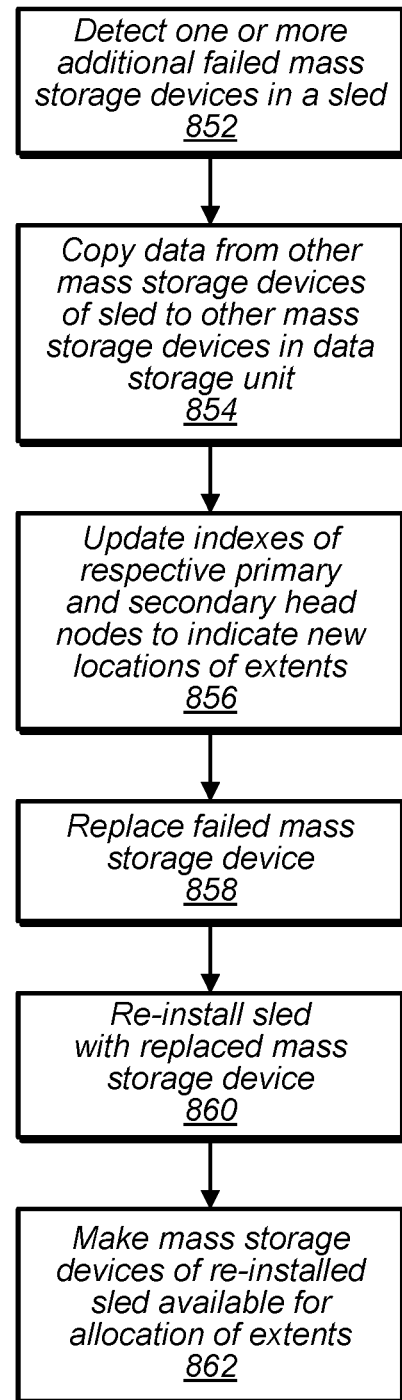
FIG. 8B is a high-level flowchart illustrating operations performed by a head node in response to a failed mass storage device in a data storage sled of a data storage unit, according to some embodiments.

FIG. 8B is a high-level flowchart illustrating operations performed by a head node in response to a failed mass storage device in a data storage sled of a data storage unit, according to some embodiments.

In some embodiments, a data storage system may tolerate one or more failed mass storage devices in a particular sled before the mass storage devices are replaced. For example, at 852 one or more additional failed mass storage devices are detected in a data storage sled. In some embodiments the additional failed mass storage devices may be in the same data storage sled as the failed mass storage device described in FIG. 8A or may be in a different data storage sled of the data storage unit.

At 854, data from other non-failed mass storage devices each in a data storage sled that includes a failed mass storage device is copied to other mass storage devices in other data storage sleds of the data storage unit. In some embodiments, only data from non-failed mass storage devices that are included in a data storage sled that is to be repaired may be copied. In some embodiments, copying the data from the non-failed mass storage devices may include recreating the data from a set of columns stored on remaining non-failed mass storage devices and then erasure encoding the data across another set of columns of mass storage devices of a replacement extent. For example, in a 4+2 erasure encoding scheme, data of an extent may be recreated from any four of the six columns of the extent. After being recreated, the data may be erasure encoded across another set of 4+2 columns of a replacement extent.

At 856, indexes of a primary head node and a secondary head node that are designated for each volume that included an extent in the affected mass storage devices are updated to indicate the new locations of the data for the volumes that has been copied to other mass storage devices in the data storage unit.

At 858, the data storage sled(s) that includes the failed mass storage device is at least partially removed from the data storage unit and the failed mass storage device is replaced. Because data previously stored on the non-failed mass storage devices of the data storage sled being removed has been copied to other mass storage devices of the data storage unit, the data remains available even while the data storage sled is at least partially removed from the data storage unit.

At 860, the data storage sled with the replaced mass storage device is re-installed in the data storage unit. At 862 mass storage devices of the replaced data storage sled are made available for allocation of columns on the mass storage devices of the data storage sled. In some embodiments, data storage space of the non-failed mass storage devices of the data storage sled may be released and made available to store data for newly allocated extents. In some embodiments, the non-failed mass storage devices may still store volume data that has been copied to other mass storage devices in the data storage unit. In some embodiments, the indexes of the respective head nodes may be updated to indicate volume data that is still stored on the non-failed mass storage devices.

Multi-Tier Control Plane

In some embodiments, a data storage system may include multiple data storage units. Management of the data storage system may be performed by a multi-tiered control plane. For example, in some embodiments a zonal control plane may determine which data storage units new volumes are to be allocated to and may perform migration of volumes between data storage units to balance loads. Also, in some embodiments, a local control plane of a data storage unit may determine which head nodes of the data storage unit are to be assigned to a particular volume or volume partition as a primary head node and a secondary head node. Also, a local control plane may manage allocation of extents within a data storage unit via a "sandbox" technique and may perform fail over operations in response to a failure of a head node, a mass storage device, or a data storage sled. In some embodiments, a data storage unit may operate autonomously from a zonal control plane subsequent to a volume being assigned to the data storage unit. Because data storage units may operate autonomous from a zonal control plane, a failure of a zonal control plane may not impact a data storage unit's ability to respond to read and write requests or perform fail-over operations in response to a failure of a head node or a mass storage device. Also, because a local control plane of a data storage unit only affects a single data storage unit, a failure of a local control plane may have a blast radius that is limited to a single data storage unit. Furthermore, a data storage unit may implement a local control plane on one or more head nodes of a data storage unit and implement a lease protocol to allow for fail over of the local control plane from one head node to another head node in response to a failure of a head node implementing the local control plane. In some embodiments, a local control plane may utilize a distributed value store that is distributed across the plurality of head nodes of the data storage unit. Thus, when a particular head node implementing a local control plane fails, another head node taking over implementation of the local control plane may utilize the distributed value store without values in the value store being lost due to the failure of the head node previously implementing the local control plane.

Figure 9A:
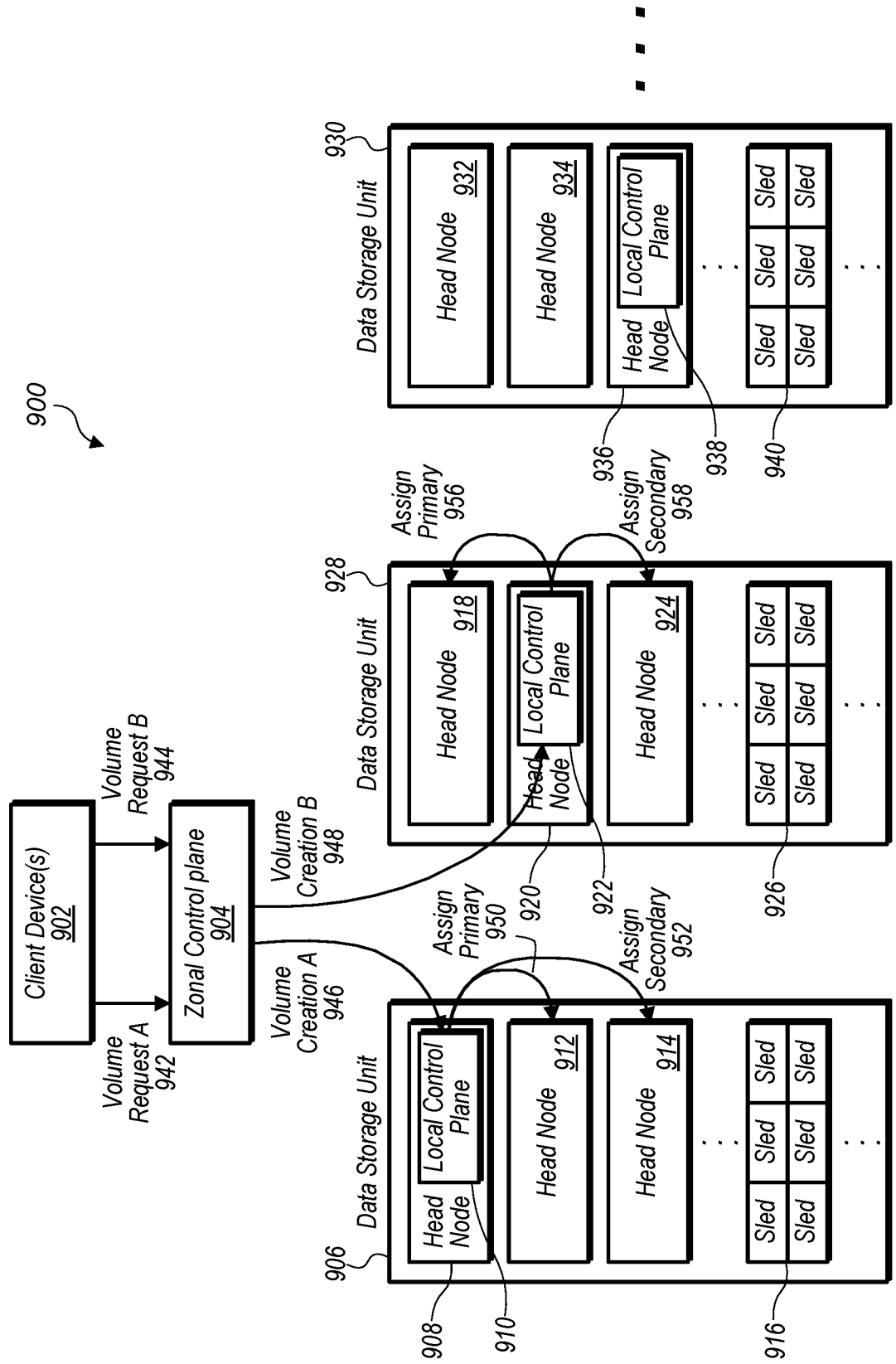
FIG. 9A is a block diagram illustrating a process for creating a volume involving a zonal control plane, a local control plane, and head nodes of a data storage system, according to some embodiments.

FIG. 9A is a block diagram illustrating a process for creating a volume involving a zonal control plane, a local control plane, and head nodes of a data storage system, according to some embodiments. Data storage system 900 includes one or more computing devices that implement zonal control plane 904 and also includes data storage units 906, 928, and 930. Data storage units 906, 928, and 930 may be the same as any of the data storage units described in FIGS. 1-8. Data storage unit 906 includes head nodes 908, 912, and 914 and data storage sleds 916. A local control plane 910 is implemented on head node 908. Data storage unit 928 includes head nodes 918, 920, and 924 and data storage sleds 926. A local control plane 922 for data storage unit 928 is implemented on head node 920. Data storage unit 930 includes head nodes 932, 934, and 936 and sleds 940. A local control plane 938 for data storage unit 930 is implemented on head node 936. As can be seen a local control plane for a data storage unit can be implemented on any one or more head nodes of a plurality of head nodes of a data storage unit. In some embodiments, a local control plane may be logically separated from a data plane of a head node, for example a local control plane may be located in a separate container. In some embodiments, each head node of a data storage unit may include logically isolated program instructions for implementing a local control plane and a portion of a distributed value store distributed across logically isolated portions of respective ones of the head nodes. In such embodiments, a given head node holding a lease for implementing the local control plane may implement the local control plane using the program instructions stored in the given head node. Upon failure of the given head node, another given head node may assume the lease for implementing the local control plane and may implement the local control plane using the program instructions for implementing the local control plane stored in the other given head node. For example, the given head node and the other given head node may both store program instructions for implementing the local control plane and a single one of the given head node or the other given head node may implement the local control plane at a given time.

Client device(s) 902 may be part of a separate network that is separate from data storage system 900, such as a customer network, or may be client devices within a provider network that utilizes data storage system 900. Client device(s) 902 send volume request A 942 and volume request B 944 to zonal control plane 904 to request volumes of data storage system 900 be allocated to the client devices. In response, zonal control plane 904 issues a volume creation instruction A 946 to data storage unit 906 and a volume creation instruction B 948 to data storage unit 928. In some embodiments, volume creation instructions from a zonal control plane may be processed by a local control plane of a data storage unit. For example, local control plane 910 of data storage unit 906 processes volume creation instruction A 946 and local control plane 922 of data storage unit 928 processes volume creation instruction B 948. In some embodiments, a zonal control plane may receive accumulated performance and usage metrics from data storage units and assign volumes, based on the accumulated performance and usage metrics. For example, a zonal control plane may attempt to balance loads between data storage units by selecting to assign new volumes to data storage units that have accumulated performance and usage metrics that indicate less load than other data storage units.

In order to process a volume creation instruction, a local control plane may assign a head node of a data storage unit to function as a primary head node for a volume and may assign another head node of a data storage unit to function as a secondary head node for the volume. For example, local control plane 910 assigns head node 912 as a primary head node for the newly created volume via assignment 950 and assigns head node 914 as secondary head node for the volume via assignment 952. Also, local control plane 922 of data storage unit 928 assigns head node 918 as a primary head node for a newly created volume via assignment 956 and assigns head node 924 as a secondary head node for the volume via assignment 958. As can be seen, any one of the head nodes of a data storage unit may be selected to function as a primary or secondary head node for a given volume or volume partition. Also, a local control plane of a data storage unit may collect performance information from head nodes and select primary and secondary head nodes for a given volume based on a current loading of head nodes in a data storage unit. In some embodiments, a local control plane may attempt to balance loads between head nodes when assigning primary and secondary head nodes for a given volume.

Figure 9B:
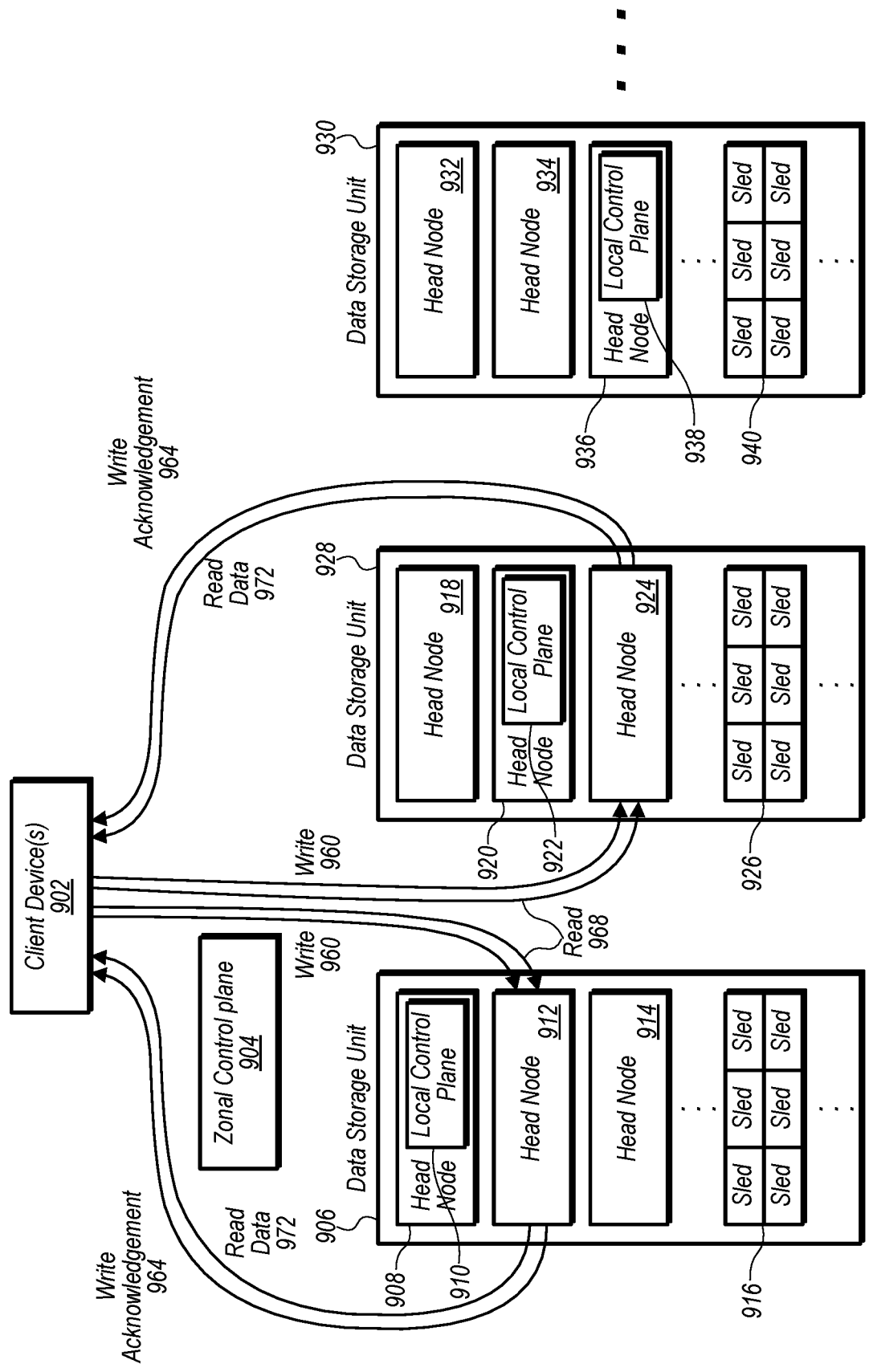
FIG. 9B is a block diagram illustrating head nodes of a data storage unit servicing read and write requests independent of a zonal control plane of a data storage system, according to some embodiments.

FIG. 9B is a block diagram illustrating head nodes of a data storage unit servicing read and write requests independent of a zonal control plane of a data storage system, according to some embodiments. Data storage system 900 illustrated in FIG. 9B is the same data storage system 900 as illustrated in FIG. 9A and shows read and write requests being sent to head nodes after primary and secondary head nodes for the newly created volumes have been assigned. As can be seen, read and write requests may be serviced by data storage units of a data storage system independent of a zonal control plane. Also, in some embodiments, read and write requests may be serviced independent of a local control plane. For example read request 968 and write request 960 are directed directly to head node 912 that functions as a primary head node for the newly created volume. Also, primary head node sends read data 972 and write acknowledgement 964 to client device(s) 902 without passing the read data 972 or the write acknowledgment 964 through zonal control plane 904 or local control plane 910. In some embodiments, each head node may be assigned at least one public network address, such as a public IP address. When a head node is assigned to function as a primary head node for a volume of a client, the primary head node's public IP address may be communicated to the client device and the client device's address may be communicated to the head node functioning as primary head node. Thus, subsequent communications between the head node and the client device may be directly routed between the exchanged address information. In some embodiments, read and write requests may be directed to both a primary and secondary head node. For example, if a client does not receive a response from a primary head node, the client may direct a read or write request to a secondary head node. In some embodiments, this may trigger a secondary head node to attempt to assume the role of primary head node.

Figure 10A:
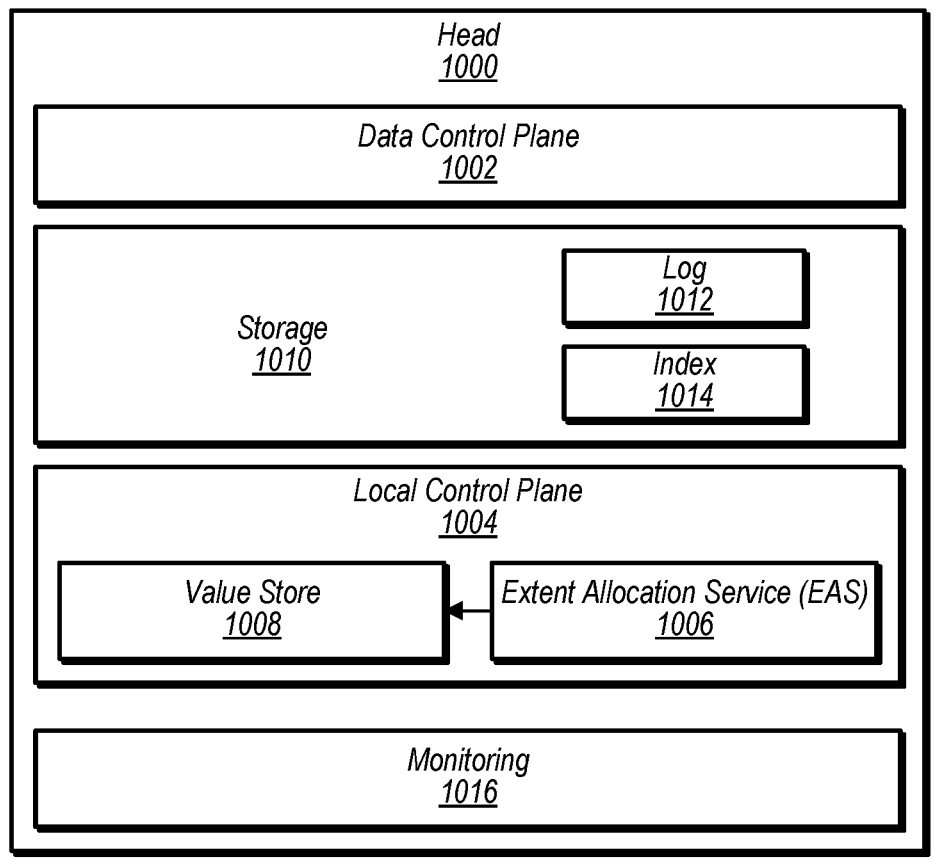
FIG. 10A is a block diagram of a head node, according to some embodiments.
Figure 10B:
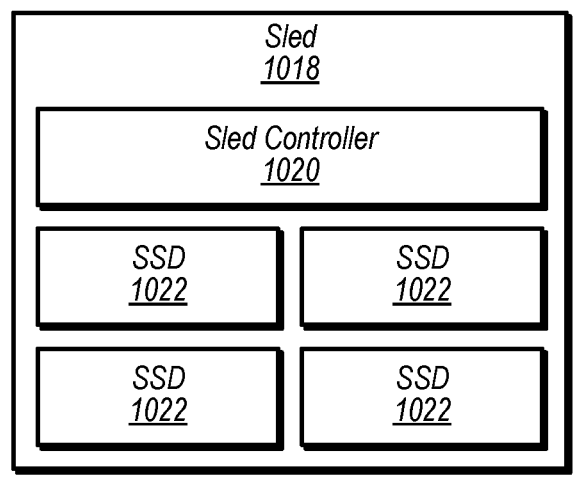
FIG. 10B is a block diagram of a data storage sled, according to some embodiments.

FIG. 10A is a block diagram of a head node, according to some embodiments. Head node 1000 may be any of the head nodes described in FIG. 1-9 or 11-19. Head node 1000 includes a data control plane 1002, storage 1010, local control plane 1004, and monitoring module 1016. A data control plane of a head node, such as data control plane 1002, may service read and write requests directed to the head node. For example, a data control plane may store one or more public IP addresses of the head node and provide the public IP addresses of the head node to client devices to allow the client devices to communicate with the head node. A storage of a head node, such as storage 1010, may include a log, such as log 1012, and an index, such as index 1014. Log 1012 and index 1014 may be similar to log 408 and index 406 as described in regard to FIGS. 4A and 4B and may store pointers for volume data indicating where the volume data is stored. In some embodiments, a data control plane, such as data control plane 1002, may consult an index, such as index 1014, in order to service read and write requests directed at a particular volume for which the head node is functioning as a primary head node. In some embodiments, an index, such as index 1014 may indicate whether a portion of volume data for a volume is stored in a log of the head node, such as log 1012, or is stored in an extent across multiple data storage sleds, such as mass storage devices 1022 of data storage sled 1018 illustrated in FIG. 10B that also includes sled controller 1020. In addition, a head node may include program instructions for implementing a local control plane that are logically isolated from the data control plane of the head node.

In some embodiments, a local control plane includes an extent allocation service, such as extent allocation service 1006, and a distributed value store, such as value store 1008. An extent allocation service may provide "sandbox" recommendations to head nodes of a data storage unit that include sets of columns from which the head nodes may select new extents. A value store may store extent allocation information and may also store head node assignment information. In some embodiments, a local control plane may provide sequence numbers to newly assigned primary head nodes. In some embodiments, a distributed value store, such as value store 1008, may be implemented over all or a portion of the head nodes of a data storage unit. This may provide fault tolerance such that if any one or more of the head nodes fail, the remaining head nodes may include data from the distributed data store, such that data from the distributed data store is not lost due to the failure of the one or more head nodes.

In some embodiments, a head node includes a monitoring module, such as monitoring module 1016. Monitoring module may collect performance and/or usage metrics for the head node. A head node, such as head node 1000 may provide performance and/or usage metrics to a local control plane, such as local control plane 1004, or may provide performance and/or usage metrics to a zonal control plane.

Figure 11:
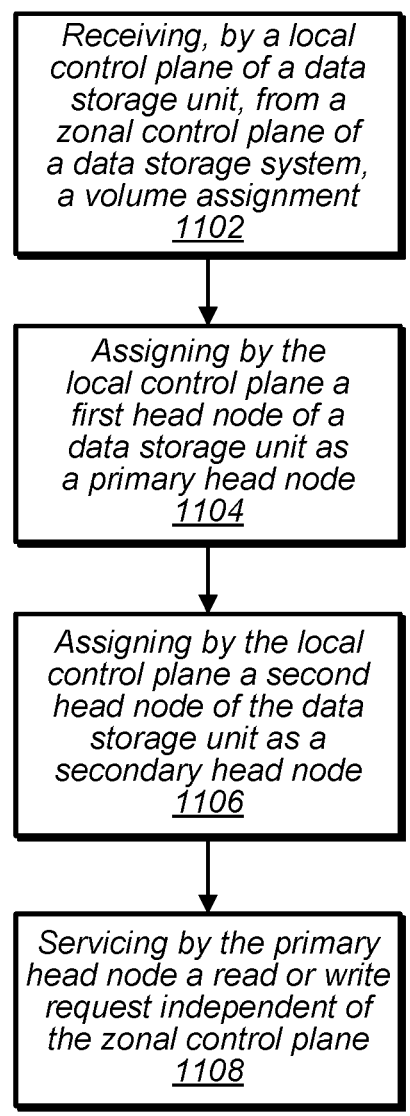
FIG. 11 is a high-level flowchart illustrating a process of creating a volume in a data storage system, according to some embodiments.

FIG. 11 is a high-level flowchart illustrating a process of creating a volume in a data storage system, according to some embodiments.

At 1102, a local control plane of a data storage unit of a data storage system receives a volume assignment from a zonal control plane of the data storage system.

At 1104, the local control plane assigns a first head node of the data storage unit to function as a primary head node for the newly created or newly assigned volume. At 1106, the local control plane assigns a second head node of the data storage unit to function as a secondary head node for the newly created or newly assigned volume. Note that in some embodiments, a zonal control plane may move volume between data storage units of a data storage system. Thus the newly assigned volume may be an existing volume being moved from another data storage unit of the data storage system. Also, a local control plane of a data storage unit may select head nodes to function as primary and secondary head nodes from any of the head nodes of the data storage unit. However, a head node functioning as a primary head node may not function as a secondary head node for the same volume. But, a given head node may function as a primary head node for more than one volume and may also function as a secondary head node for one or more other volumes.

At 1108 the primary head node for the volume services read and write requests directed at the volume. In some embodiments, a head node functioning as a primary head node may service read and write requests independent of a zonal control plane and/or independent of a local control plane of a data storage unit.

Figure 12A:
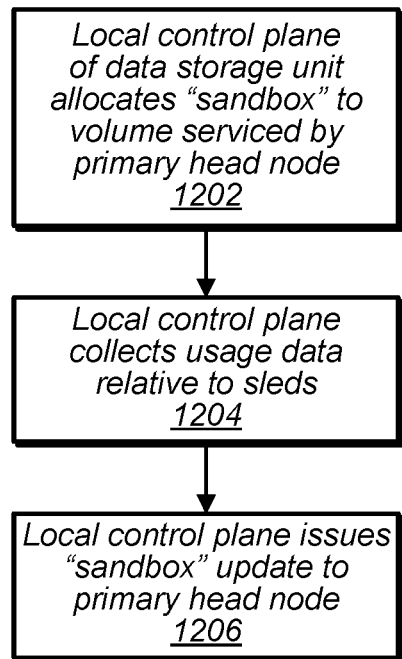
FIG. 12A is a high-level flowchart illustrating a local control plane of a data storage unit providing storage recommendations to a head node of the data storage unit for locations to store data in data storage sleds of the data storage unit for a volume serviced by the head node, according to some embodiments.

FIG. 12A is a high-level flowchart illustrating a local control plane of a data storage unit providing storage recommendations to a head node of the data storage unit for locations to store data in data storage sleds of the data storage unit for a given volume, according to some embodiments.

At 1202, a local control plane of a data storage unit allocates a "sandbox" to a particular volume serviced by a primary head node functioning as primary head node for the particular volume. The sandbox may include a set of columns of mass storage devices from which the head node is recommended to select extents for the particular volume. In some embodiments, the sandbox may include extents that already include corresponding columns in multiple mass storage devices and the head node may be recommended to select extents for the particular volume from the extents included in the sandbox recommendation.

At 1204, the local control plane collects performance metrics from data storage sleds and/or head nodes in the data storage unit.

At 1206, the local control plane issues "sandbox' updates to the primary head node functioning as a primary head node for the particular volume. The sandbox updates may be based on the collected performance metrics collected at 1204. A local control plane may allocate sandbox recommendations and update sandbox recommendations to avoid heat collisions wherein multiple head nodes are attempting to access the same data storage sleds at the same time. In some embodiments, a sandbox recommendation may be a loose constraint and a head node functioning as a primary head node may select columns or extents that are not included in a sandbox recommendation. It should also be noted that sandbox recommendation and performance and/or usage metrics collection may be performed outside of the I/O path. Thus, if there is a failure or corruption of the local control plane, reads and writes may continue to be processed by non-affected head nodes of a data storage unit. Also, a sandbox allocated to a particular volume may remain with the particular volume during a failover of head nodes. For example, if a primary head node for a particular volume fails, the sandbox allocated for the particular volume may move with the particular volume that will now be serviced by a former secondary head node. Subsequent to a head node failover, sandbox updates, such as the sandbox updates described at 1206, may be issued from the local control plane to the new primary head node for the volume.

Figure 12B:
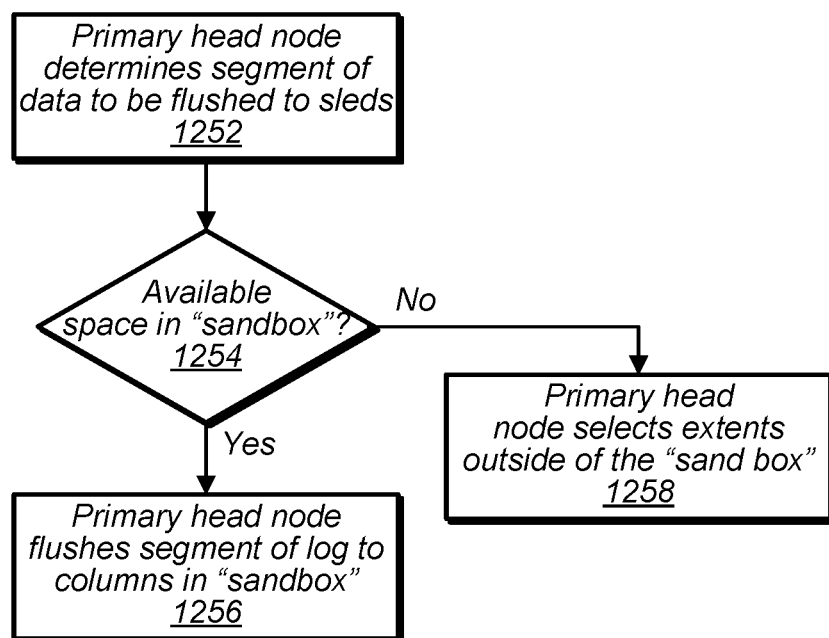
FIG. 12B is a high-level flowchart illustrating a head node of a data storage unit storing data in data storage sleds of the data storage unit, according to some embodiments.

FIG. 12B is a high-level flowchart illustrating a head node of a data storage unit storing data in data storage sleds of the data storage unit, according to some embodiments.

At 1252, a primary head node determines a segment of data to be flushed to mass storage devices in data storage sleds of a data storage unit. For example, exceeding one or more thresholds, such as an amount of data stored in a log, an age of data stored in a log, or an infrequency at which the data is accessed in a log, may trigger a primary head node to flush data to data storage sleds.

At 1254, a primary head node may determine if there is available space in a sandbox allocated to a volume serviced by the primary head node. At 1256, in response to determining there is sufficient space in the sandbox, the primary head node flushes the data to extents that include columns in the allocated sandbox allocated for the volume. At 1258, in response to determining there is insufficient space in the sandbox or in response to determining a placement in the sandbox will violate a placement restriction, such as a durability level, the primary head node selects extents outside of the sand box.

Figure 13:
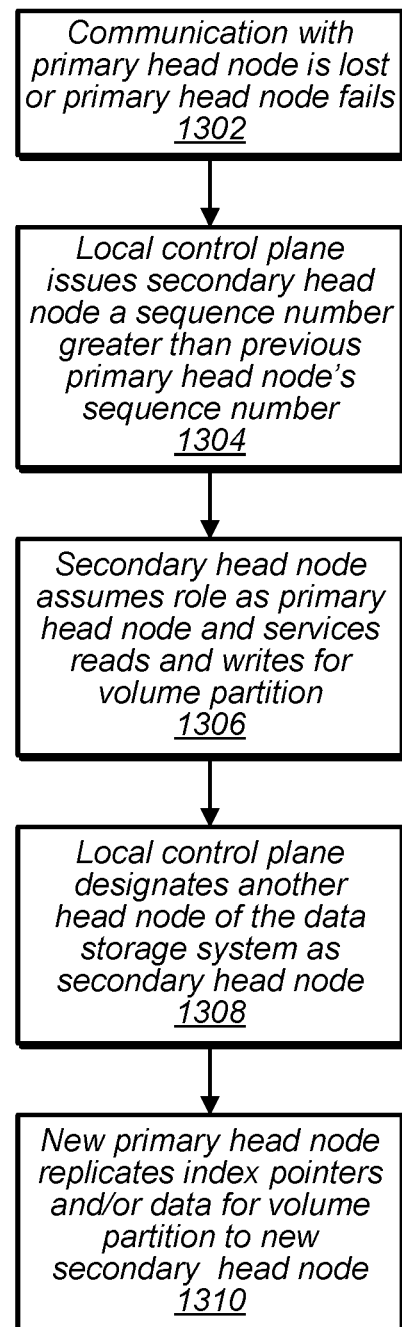
FIG. 13 is a high-level flowchart illustrating head nodes of a data storage unit performing a fail over operation in response to a failure of or loss of communication with one of the head nodes of the data storage unit, according to some embodiments.

FIG. 13 is a high-level flowchart illustrating head nodes of a data storage unit performing a fail over operation in response to a failure of or loss of communication with one of the head nodes of the data storage unit, according to some embodiments.

At 1302 communication with a primary head node is lost or the primary head node fails. In some embodiments, a client device may lose contact with a primary head node and the client device may contact the secondary head node. This may trigger the secondary head node to attempt to take over as primary head node.

At 1304, in response to the secondary head node attempting to take over as primary head node, the local control plane issues a new sequence number to the secondary head node. The new sequence number may be greater than a sequence number previously issued to the previous primary head node. The new sequence number may be used by the secondary head node to gain write access to extents that were previously reserved for write access only by the previous primary head node.

At 1306, the secondary head node assumes the role of primary head node and begins to service writes directed to the volume. In some embodiments, the secondary head node may assume the role of primary head node by presenting the new sequence number received from the local control plane to sled controllers of the data storage system and receiving, from the sled controllers, credentials for writing to columns that store data of the volume.

At 1308, the local control plane designates another head node of the data storage unit to function as a secondary head node for the volume or volume partition. Note that the previous secondary head node has assumed the role of primary head node, such that the volume is without a secondary head node causing the local control plane to designate a new secondary head node.

At 1310, the new primary head node (previous secondary head node) replicates log and index data for the volume to the newly designated secondary head node. In some embodiments, replicating log and index data may include replicating index data for the volume including pointers for volume data stored in data storage sleds of a data storage unit and volume data stored in the log of the new primary head node (previous secondary head node) that has not yet been flushed to the data storage sleds.

Figure 14:
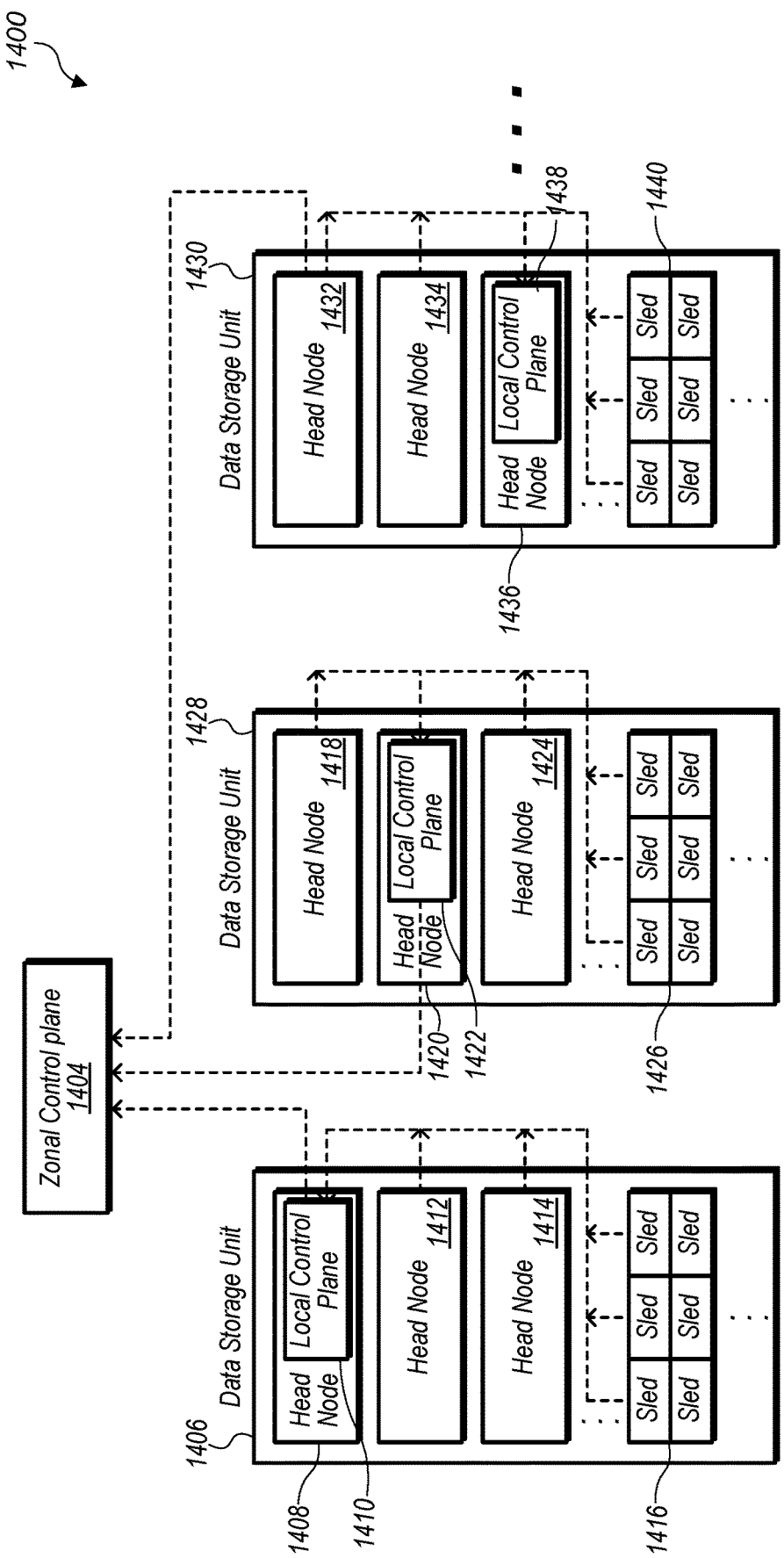
FIG. 14 is a block diagram illustrating performance and/or usage metrics being collected and accumulated in a data storage unit, according to some embodiments.

FIG. 14 is a block diagram illustrating performance and/or usage metrics being collected and accumulated in a data storage unit, according to some embodiments.

Data storage system 1400 may be the same as data storage system 900 illustrated in FIG. 9. Data storage system includes zonal control plane 1404 and data storage units 1406, 1428, and 1430. In some embodiments, data storage sleds and head nodes of a data storage unit may report performance and usage metrics to a local control plane for the data storage unit. For example, head nodes 1408, 1412, and 1414 of data storage unit 1406 report performance and usage metrics to local control plane 1410 of data storage unit 1406. Also, a sled controller of each of data storage sleds 1416 may report performance and usage metrics to local control plane 1410. In a similar manner, data storage sleds 1426 and head nodes 1418, 1420, and 1424 of data storage unit 1428 may report performance and usage metrics to local control plane 1422 of data storage unit 1428. Likewise, data storage sleds 1440 and head nodes 1432, 1434, and 1436 of data storage unit 1430 may report performance and usage metrics to local control plane 1438. In some embodiments, each local control plane of a data storage unit may in turn report accumulated performance and usage metrics to a zonal control plane for the data storage system. For example, local control planes 1410, 1422, and 1438 report performance and usage metrics to zonal control plane 1404. In some embodiments local control planes may use performance and usage metrics to balance loads between head nodes and to update sandbox recommendations that indicate recommended data storage sleds from which head nodes should select extents for a given volume. Also, a zonal control plane may use cumulative performance and usage metrics to balance volume assignments and/or move volumes between data storage units. In some embodiments, performance and usage metrics may be used by a local control plane to balance loads within a given data storage unit and accumulated performance and usage metrics may be used by a zonal control plane to balance loads between data storage units.

Input/output Fencing of Mass Storage Devices from Unauthorized Head Nodes

In some embodiments, a sled controller of a data storage sled may implement a fencing protocol that prevents unauthorized head nodes from writing data to columns of mass storage devices located in a data storage sled along with the sled controller. In some embodiments, a sled controller may issue credentials or tokens to head nodes for accessing columns allocated to a particular volume serviced by the respective head nodes. The sled controller may only issue a new token to a head node if a column associated with the credential or token is not currently reserved or if a head node seeking to access the column presents a sequence number greater than a sequence number stored for the column that indicates a sequence number of a previous head node that requested to access the column. For example, a newly designated primary head node for a given volume may receive from a local or zonal control plane a sequence number for the given volume that is greater than a previously issued sequence number for the given volume. The newly designated primary head node may then present the new sequence number to sled controllers of data storage sleds that include columns allocated for the volume. The sequence number of the newly designated primary head node may be greater than a sequence number stored in the columns that corresponded to a sequence number of a previous primary head node that accessed the columns. Upon determining that the newly designated primary head node has presented a sequence number greater than a stored sequence number, the sled controllers may issue a new token to the newly designated primary head node for accessing the columns.

Figure 15:
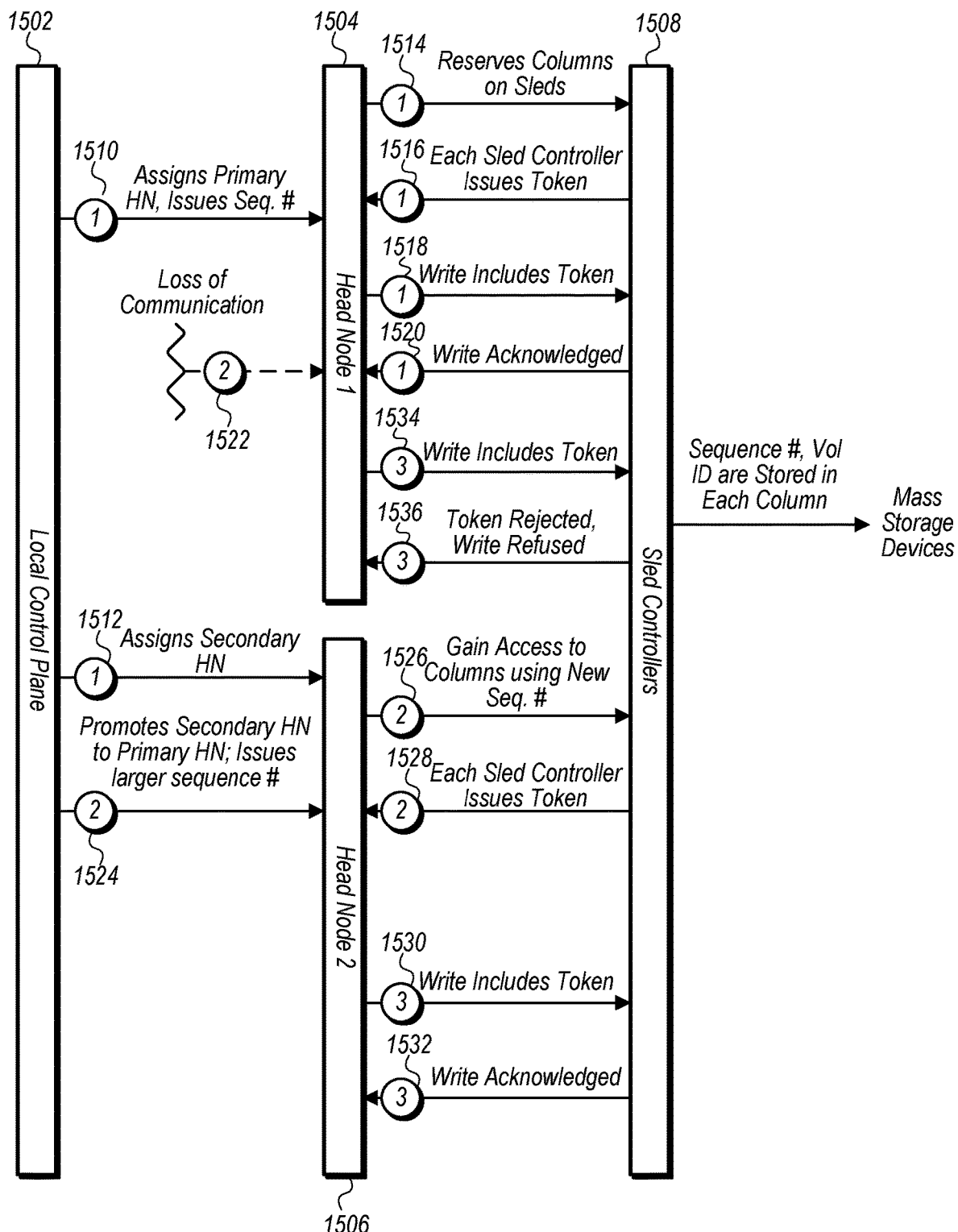
FIG. 15 illustrates interactions between a local control plane, head nodes, and data storage sleds of a data storage unit in relation to writing data to mass storage devices of a data storage sled of a data storage unit, according to some embodiments.

For example, FIG. 15 illustrates interactions between a local control plane, head nodes, and data storage sleds of a data storage unit in relation to writing data to mass storage devices of a data storage sled of the data storage unit, according to some embodiments. Various interactions are illustrated between local control plane 1502 of data storage unit, head nodes 1504 and 1506 of the data storage unit and sled controllers 1508 of the data storage unit. Any of the data storage units described herein may include a local control plane, head nodes and sled controllers of data storage sleds that function as described in FIG. 15.

Phases 1, 2, and 3 are illustrated to show interactions that take place at different phases of operation of a data storage system. For example, phase 1 may be a normal phase in which a head node is assuming the role of primary head node for a volume or volume partition and functioning as the primary head node for the volume or volume partition. Phase 2 may represent a failover phase in which a secondary head node is assuming the role of primary head node for the volume, and phase 3 may represent a new normal phase wherein a newly designated primary head node is functioning as a primary head node for the volume.

At phase 1, local control plane 1502 assigns (1510) head node 1504 to be a primary head node for a volume and assigns (1512) head node 1506 to be a secondary head node for the volume. Assignment 1510 may include a new sequence number that is a monotonically increasing number that is greater than all sequence numbers previously issued by the local control plane 1502. At phase 1, in order to reserve columns of mass storage devices in different ones of multiple data storage sleds of a data storage unit, head node 1504 presents (1514) the new sequence number to sled controllers 1508 and reserves (1514) columns on mass storage devices located in data storage sleds that include the sled controllers 1508. At 1516, the sled controllers issue credentials or tokens to head node 1504 indicating that the columns are reserved for the volume and that head node 1504 is functioning as primary head node for the volume. At 1518, head node 1504 then issues a write request to sled controllers 1508 and includes along with the write requests the tokens or credentials issued by the sled controllers. The sled controllers verify that the credentials or tokens included with the write request are valid, perform the requested write, and at 1520 issue a write acknowledgement to head node 1504. Also the sled controllers store the sequence number and volume ID or volume partition ID in each column along with the data included with the write request.

During phase 2 or the fail over phase, communication is lost with head node 1504 at 1522. In some embodiments, loss of communication with a primary head node may be triggered by a client device failing to be able to reach the primary head node and instead contacting the secondary head node. In such embodiments, the secondary head node may attempt to take over as primary head node (not illustrated in FIG. 15). In some embodiments, a local control plane may determine that a primary head node has been lost. In response to determining that a primary head node has failed or there is a loss of communication with a primary head node, at 1524, local control plane 1502 promotes head node 1506 to primary head node for the volume and issues a new sequence number to head node 1506. Head node 1506 then, at 1526, presents the new sequence number issued to head node 1506 to sled controllers 1508 and requests access to the columns that store data for the volume for which head node 1506 is now the primary head node. The new sequence number issued to head node 1506 is greater than the sequence number issued to head node 1504 at 1510. At 1528, the sled controllers issue a new token or credential to head node 1506 that supersedes the token or credential issued to head node 1504 at 1516.

During phase 3, head node 1506 functions as a primary head node for the volume. At 1530 head node 1506 includes with subsequent write requests the tokens issued from the sled controllers at 1528. At 1532 sled controllers acknowledge subsequent writes from head node 1506. Also, at 1534 head node 1504 that has lost communication with control plane 1502 and/or head node 1506 attempts to perform a write to columns assigned to the volume. However, subsequent to the failover, head node 1504 is no longer the primary head node for the volume and head node 1506 is functioning as primary head node for the volume. Thus, head node 1506 has exclusive access to columns of mass storage devices of extents allocated to the volume. Thus, at 1534 when head node 1504 attempts to access the columns sled controllers 1508 decline (1536) to perform the write. In addition, at 1536 the head node 1504 may read the volume ID and new sequence number stored in the columns assigned to the volume. The columns may store the new sequence number issued to head node 1506 during the failover. Upon determining that a new sequence number has been stored that supersedes the sequence number last issued to head node 1504, head node 1504 may determine that it is no longer primary head node for the volume and may assume a role of secondary head node for the volume.

Note that each column stores a volume or volume partition ID for a volume for which the column is allocated along with a most recent sequence number. The volume ID and sequence number may be saved in persistent memory of the column. Also, a sled controller may store volume ID and sequence number information in a volatile memory of the sled controller. However, when a sled controller is reset, e.g. loses power, the volume and sequence number stored in the sled controller may be lost. However, volume and sequence number information stored in columns of mass storage devices may be persisted. This avoids complications that may arise if mass storage devices are moved between data storage sleds. For example, if a mass storage device is moved within a data storage sled or amongst data storage sleds, sled controller volume ID and sequence number information may become inaccurate. However, because volume ID and sequence number information is lost from a sled controller whenever power is lost to the sled controller, the sled controller may be reset when a sled is removed from a data storage unit to access mass storage devices in the data storage sled avoiding such complications. Thus, subsequent to a reboot of a sled controller, head nodes serving as primary head nodes for volumes that have columns allocated on a sled that includes the sled controller may need to reclaim the columns. For example the head nodes may present respective sequence numbers issued to the head nodes and the sled controllers may issue new credentials or tokens to the head nodes if the sequence numbers presented have not be superseded, e.g. the sequence numbers stored in the columns are not greater than the sequence numbers being presented by the head nodes.

Figure 16:
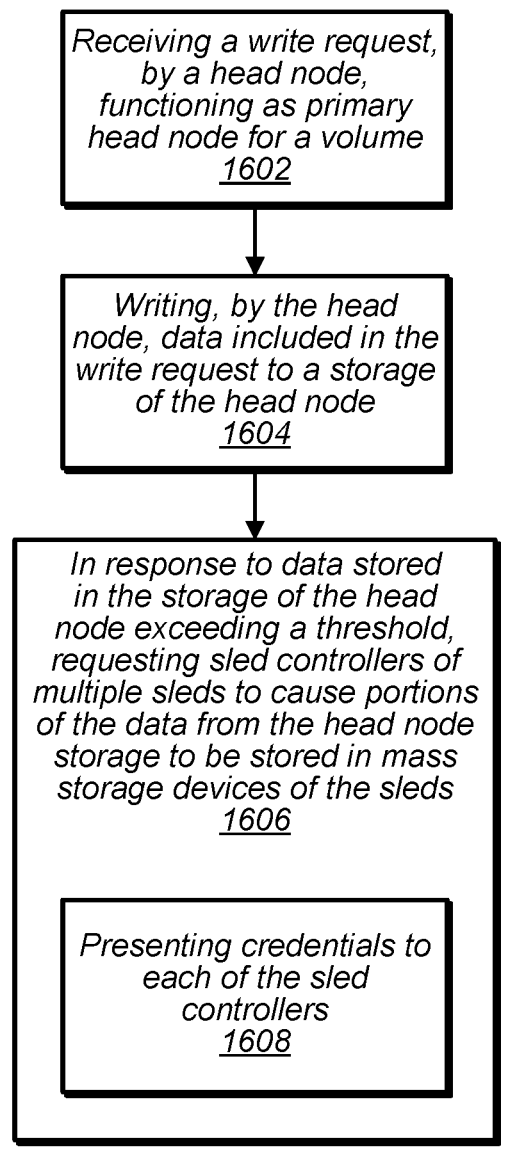
FIG. 16 is a high-level flowchart of a head node of a data storage unit flushing data stored in a storage of the head node to a data storage sled of the data storage unit, according to some embodiments.

FIG. 16 is a high-level flowchart of a head node of a data storage unit flushing data stored in a storage of the head node to a data storage sled of the data storage unit, according to some embodiments.

At 1602, a head node functioning as a primary head node for a volume receives a write request. At 1604, the head node writes data included with the write request to a storage of the head node, such as a log of the head node.

At 1606, in response to determining data stored in the storage of the head node exceeds a threshold, the head node requests sled controllers of multiple data storage sleds cause portions of the data stored in the storage of the head node be stored in multiple portions of different mass storage devices in different ones of the data storage sleds of the data storage unit. Requesting the sled controllers to store the data may further include presenting credentials (1608), such as credentials described in FIG. 15, to each of the sled controllers.

Figure 17:
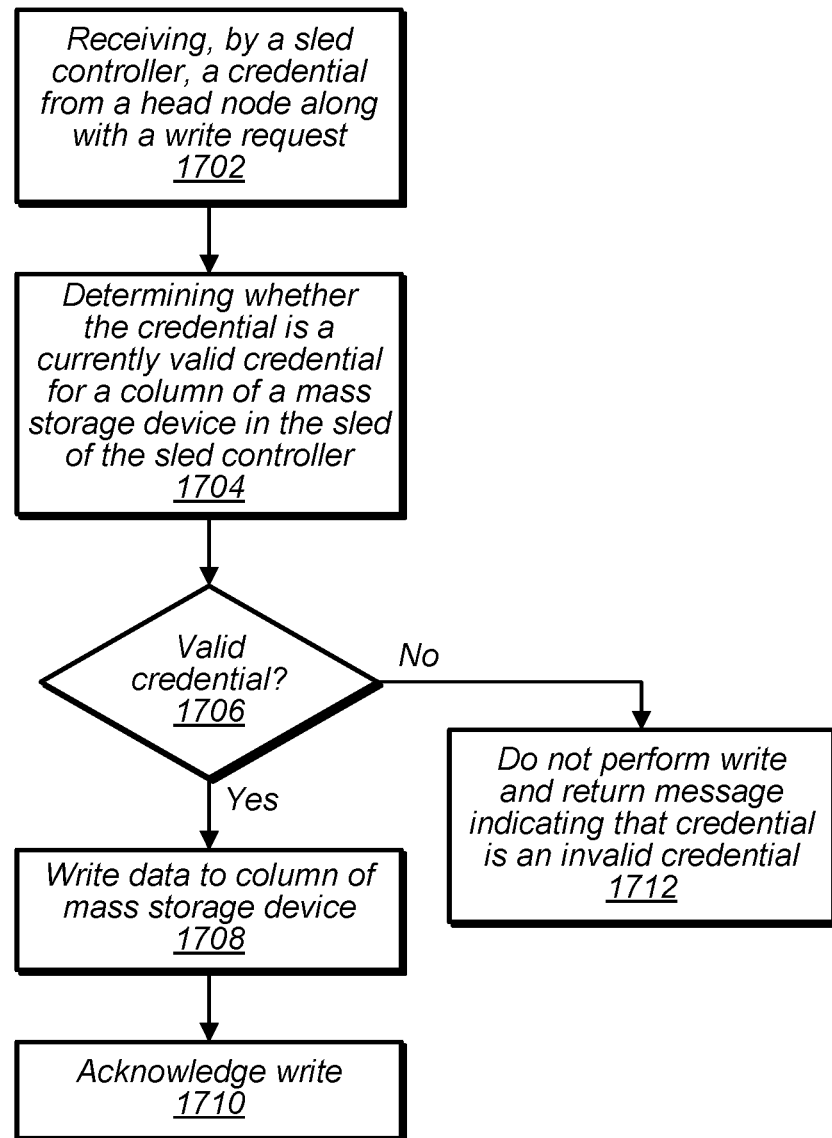
FIG. 17 is a high-level flowchart of a sled controller of a data storage sled processing a write request, according to some embodiments.

FIG. 17 is a high-level flowchart of a sled controller of a data storage sled processing a write request, according to some embodiments.

At 1702, a sled controller receives a credential from a head node along with a write request. At 1704 and 1706, the sled controller determines if the credential received at 1702 is a currently valid credential for a column of a mass storage device in a data storage sled that includes the sled controller. A sled controller may compare a sequence number and/or volume ID included in the credential with a sequence number and/or volume ID saved in the column for which access is requested. If the sequence number and/or volume ID included in the credential match the sequence number and/or volume ID stored in the column the sled controller may determine that the credential is valid. In some embodiments, a sled controller may store information that corresponds with a token or credential, such as a token number. If the information that corresponds with the token stored by the sled controller matches information included in the token, the sled controller may determine the credential or token is a valid credential. If a sequence number included in the credential or token is inferior to a sequence number stored in the column, the sled controller may determine that the credential or token is invalid. In some embodiments, a head node may not currently have credentials for a particular column and may present a sequence number that is greater than a stored sequence number stored for the column and the sled controller may issue credentials that supersede all previously issued credentials for the column, such as a new token that supersedes all tokens previously issued for the column.

At 1712, in response to determining at 1706 that the credential included with the write request is an invalid credential, the sled controller does not perform the requested write and returns a message to the head node indicating that the credential is invalid.

At 1708, in response to determining the credential is valid, the sled controller performs the requested write to the requested column of a mass storage device in the data storage sled along with the sled controller. At 1710 the sled controller acknowledges the write has been performed to the head node.

Data Storage Unit Design with Redundant Networks and Redundant Power

In some embodiments, a data storage unit may include redundant network and redundant power supplies and power distribution systems. Such redundant systems may reduce probabilities of failure thus allowing, for example, a single rack to store all parts of a volume while still meeting customer requirements for reliability and data durability. However, in some embodiments, a volume or volume partition may be stored in more than one data storage unit.

FIGS. 18A-D illustrate a data storage unit with redundant network paths within the data storage unit, according to some embodiments. Data storage unit 1850 illustrated in FIGS. 18A-D may be the same as data storage unit 100 illustrated in FIG. 1, or any other data storage unit described herein. FIGS. 18A-D further illustrate communication paths between network switches 1802 and 1804, head nodes 1806-1808, and data storage sleds 1834-1844. As can be seen, at least two redundant networks, including internal network 1852 and internal network 1854, are implemented within data storage unit 1850. Note that paths between components of data storage unit 1850 are illustrated on either side of data storage unit 1850 for clarity, but in practice paths between components of a data storage unit may be within the data storage unit over wires, cables, busways, etc. of the data storage unit.

Figure 18A:
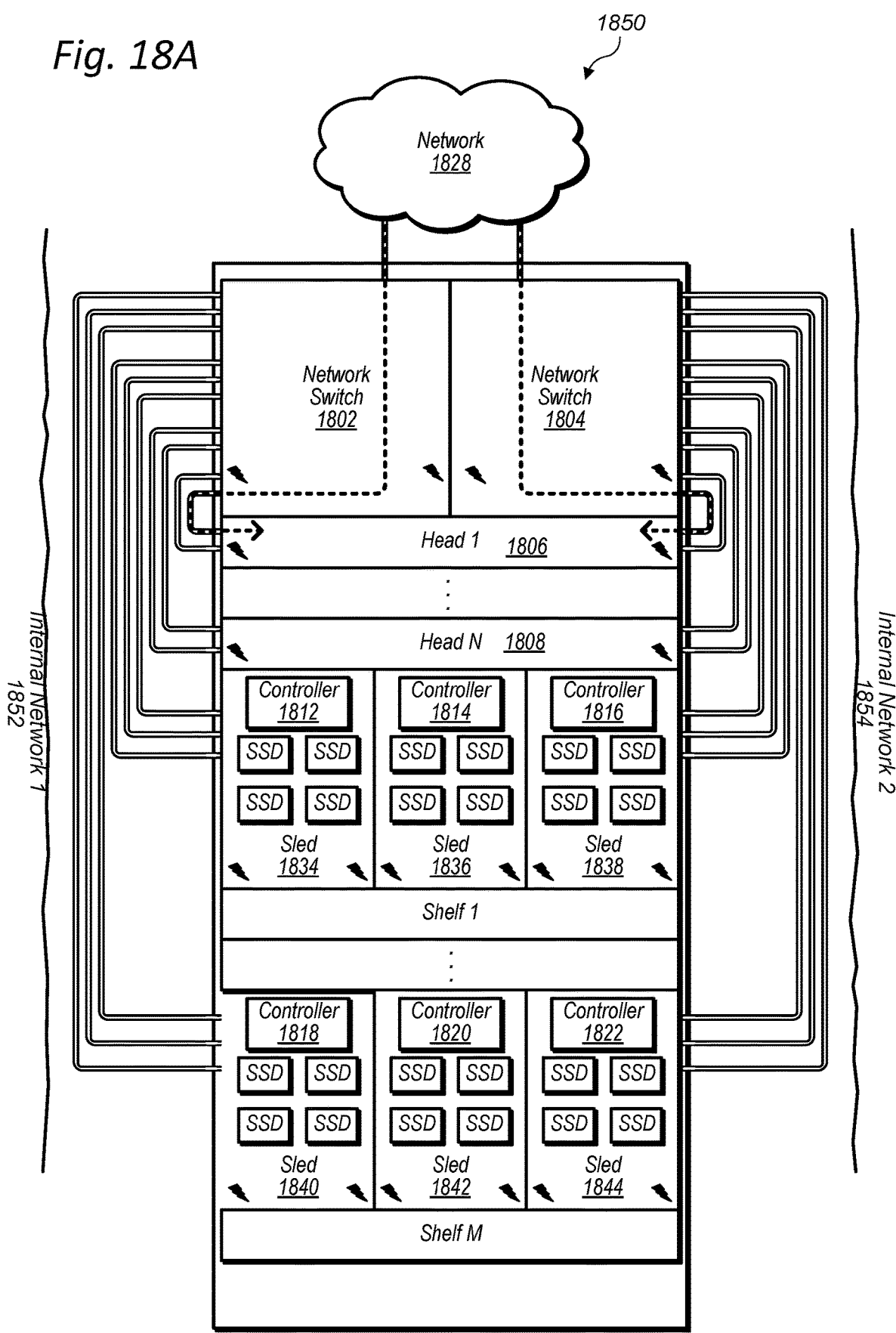
FIGS. 18A-D illustrate a data storage unit with redundant network paths within the data storage unit, according to some embodiments.

In FIG. 18A redundant communication paths are established between head node 1806 and network 1828 via network switches 1802 and 1804. In some embodiments, a head node, such as head node 1806, may be assigned redundant network addresses routable from devices external to data storage unit 1850, such as public IP addresses, and may be reachable via either one of the network address using either one of network switches 1802 and 1804.

Figure 18B:
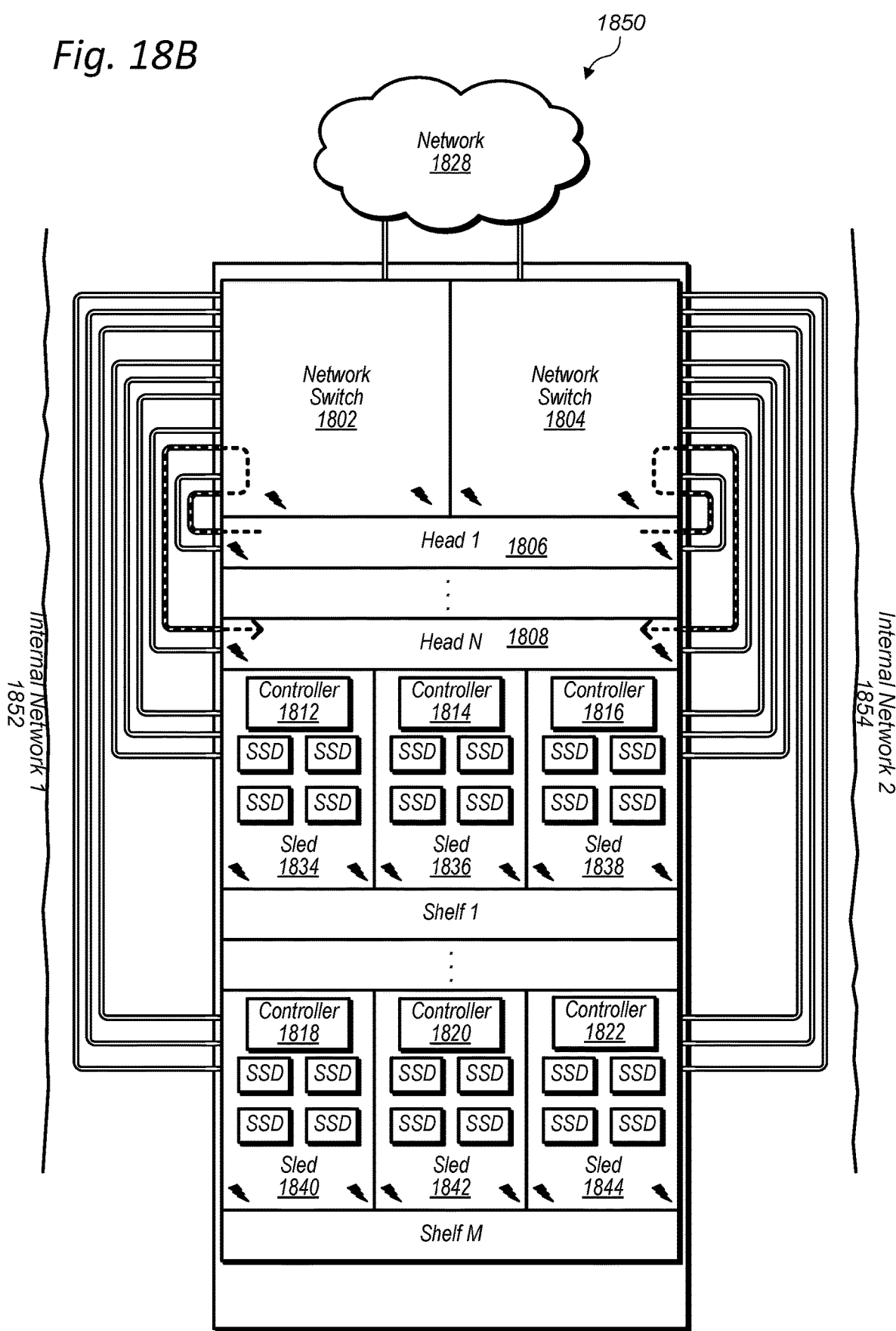

FIG. 18B illustrates redundant network paths between head nodes. For example head node 1806 may reach head node 1808 via internal network 1852 or internal network 1854, wherein internal network 1852 is via network switch 1802 and internal network 1854 is via network switch 1804. Note that there is a single network hop between head node 1806 and head node 1808 via network switch 1802 or network switch 1804. In some embodiments, a data storage unit may have a single network hop between head nodes and data storage sleds so that input/output operations do not require multiple network hops to retrieve or write data, thus improving IOPS performance and latency.

Figure 18C:
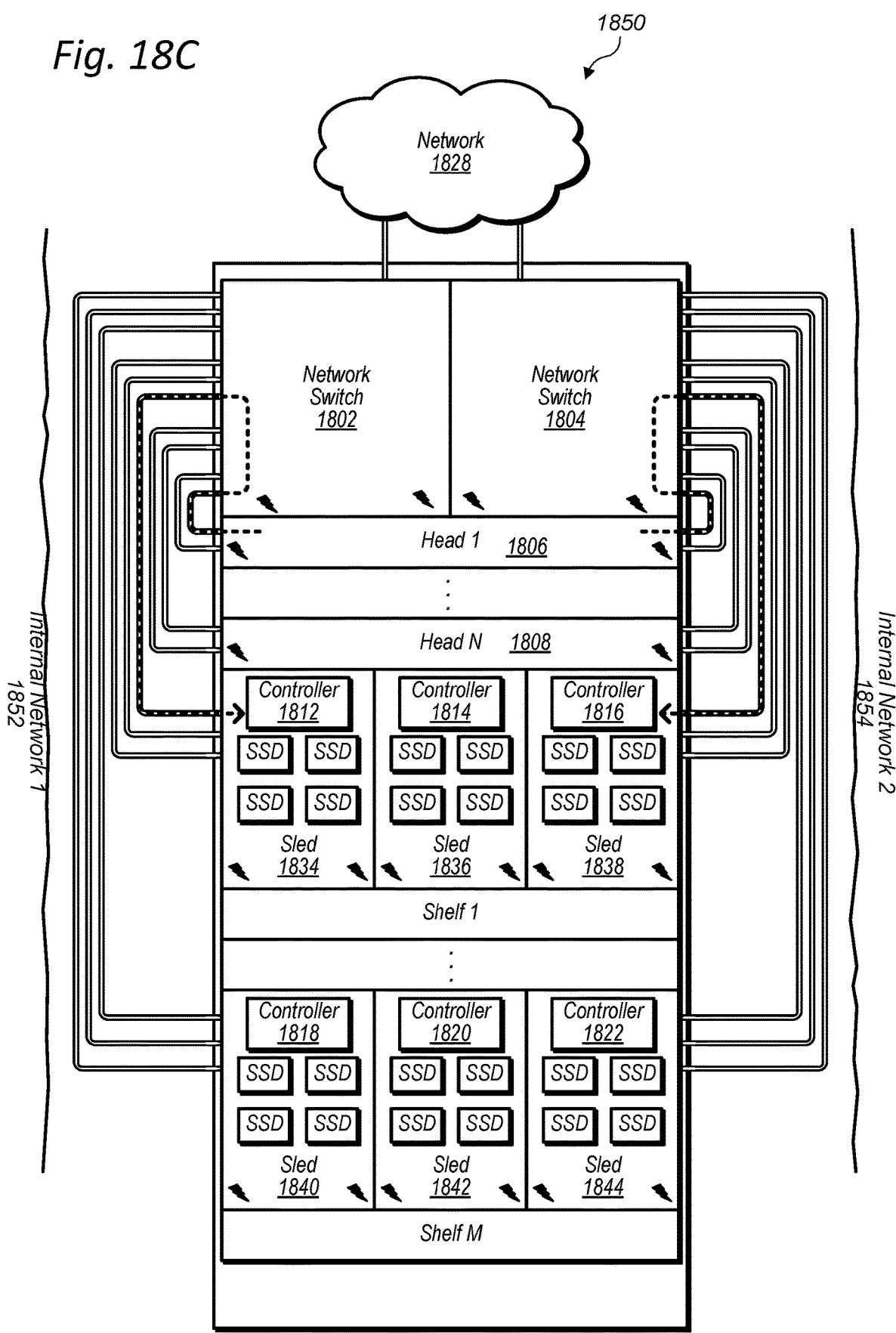
Figure 18D:
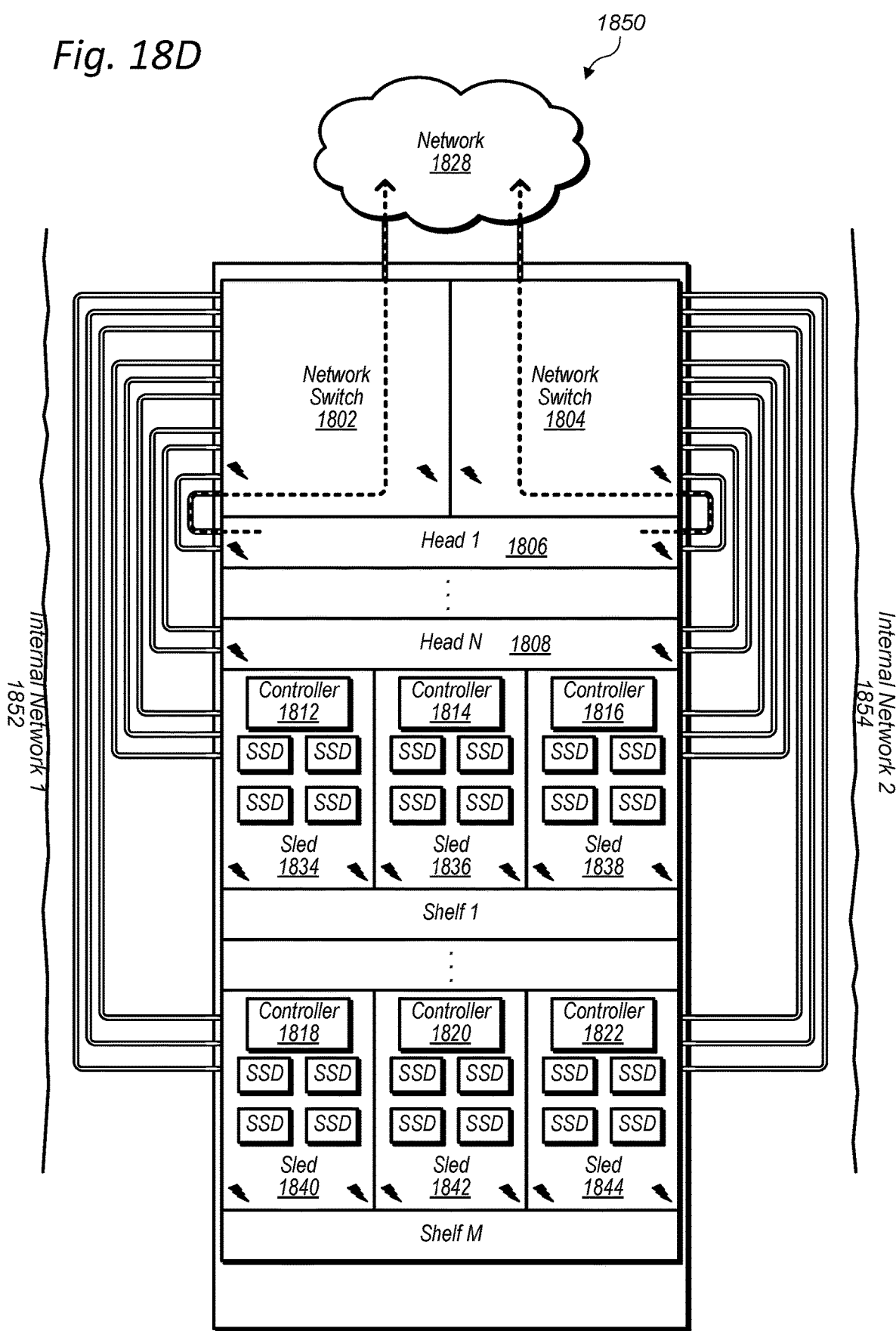

FIG. 18C illustrates redundant network paths between head nodes and data storage sleds. For example, head node 1806 may reach any of data storage sleds 1834-1844 via sled controllers 1812-1822. Each sled controller may include two network ports that each are connected to different ones of internal networks 1852 or 1854 via either one or network switches 1802 or 1804. In some embodiments, each head node may be assigned at least two private network addresses and each sled controller may be assigned at least two private network addresses. The private network addresses assigned to the head nodes and sled controllers of the data storage sleds may enable the head nodes and sled controllers to communicate with each other via either one of internal networks 1852 or 1854. FIG. 18D illustrates a head node sending a response communication to a client device via either one of internal networks 1852 or 1854.

In some embodiments, a data storage unit may be configured to accept more or less head nodes in a rack of the data storage unit or to accept more or less data storage sleds in the rack of the data storage unit. Thus, compute capacity and data storage capacity of a data storage unit may be adjusted by varying a quantity of head nodes and/or data storage sleds that are included in the data storage unit.

Figures 19A, 19B, 19C:
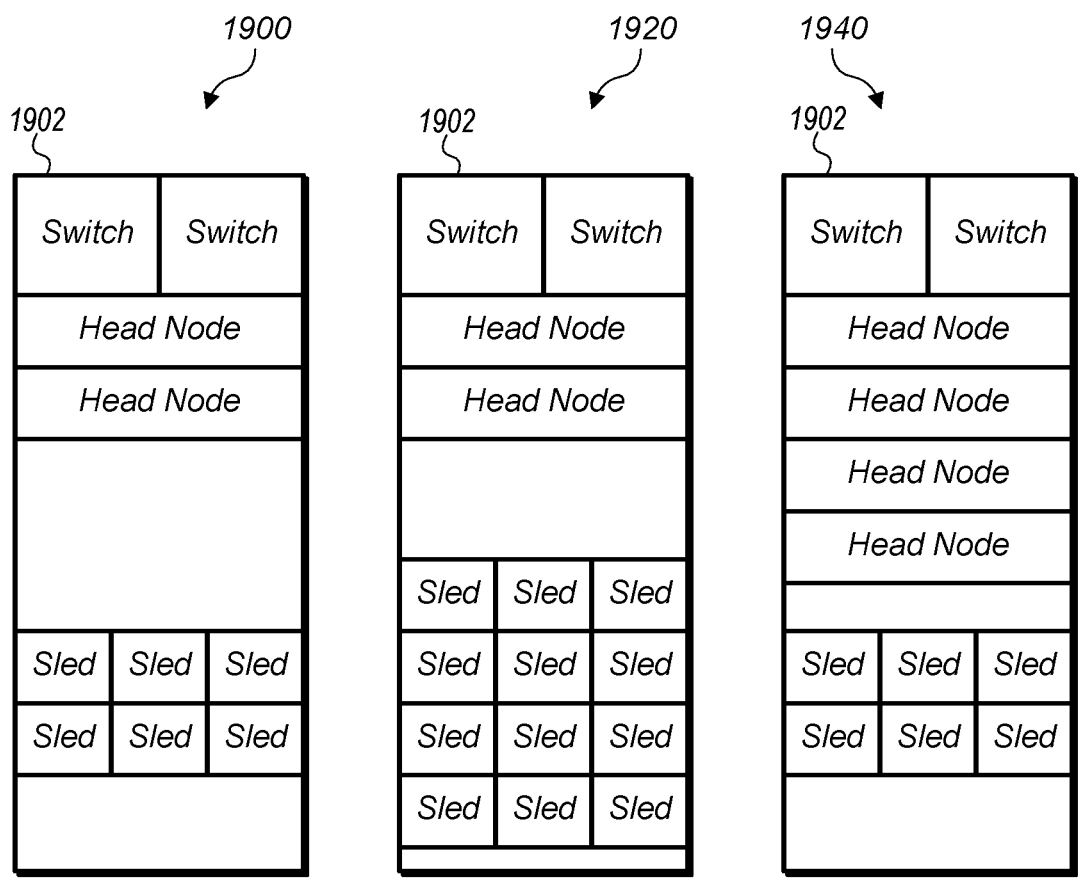
FIGS. 19A-C illustrate a data storage unit configured to allow scaling of storage capacity and processing capacity, according to some embodiments.

FIGS. 19A-C illustrate a data storage unit configured to allow scaling of storage capacity and processing capacity, according to some embodiments. For example, data storage unit 1902 is shown in arrangement 1900 in FIG. 19A and in arrangement 1920 in FIG. 19B. In arrangement 1920 data storage unit 1902 includes more data storage sleds than in arrangement 1900. Also, in arrangement 1940, data storage unit 1902 includes more head nodes than in arrangement 1900. In some embodiments, a ratio of head nodes to data storage sleds may be adjusted to meet customer needs.

Example Computer System

Figure 20:
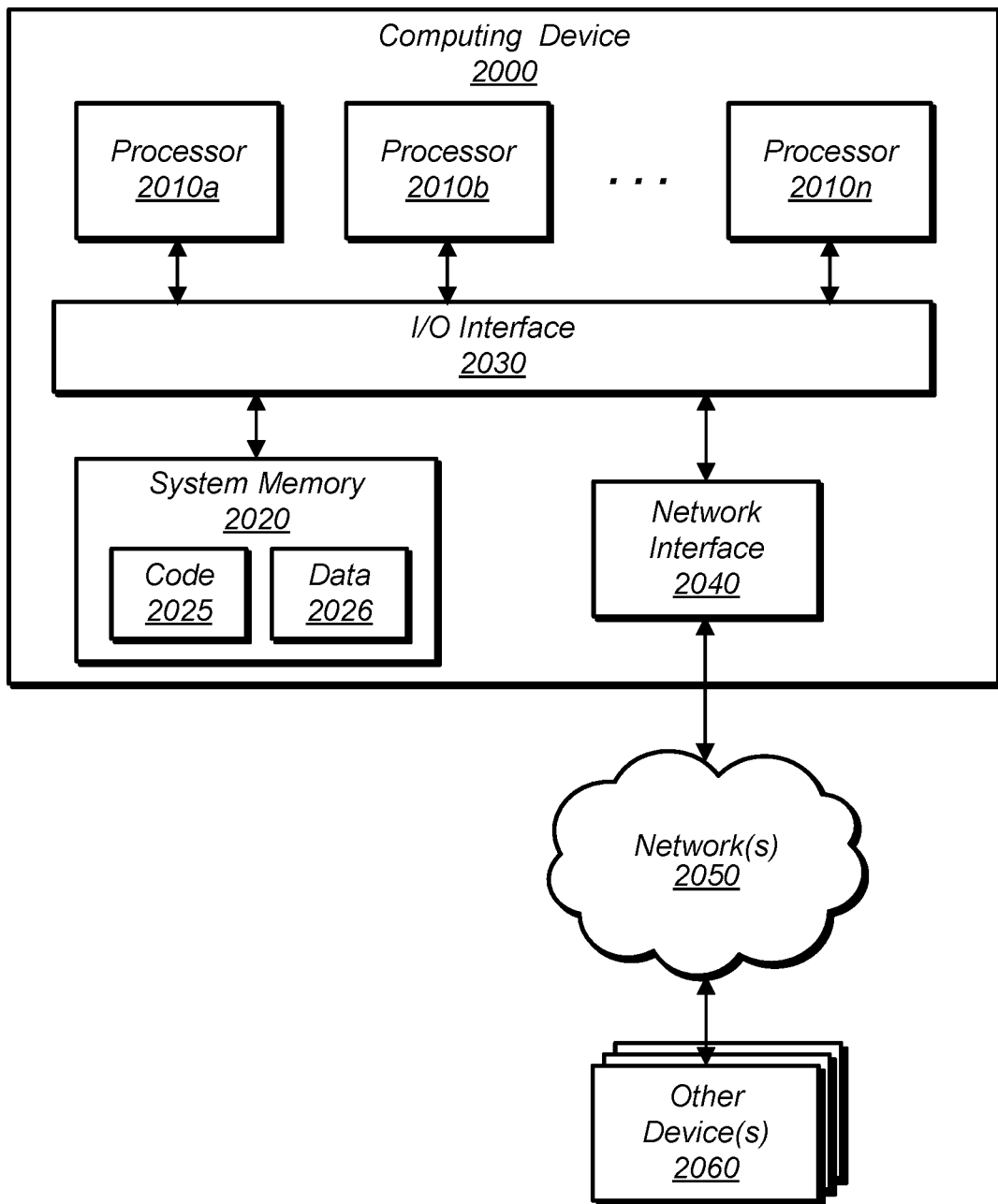
FIG. 20 is a block diagram illustrating an example computing system, according to some embodiments.

FIG. 20 is a block diagram illustrating an example computer system, according to various embodiments. For example, computer system 2000 may be configured to implement storage and/or head nodes of a data storage unit, storage and/or a sled controller of a data storage sled, other data stores, and/or a client, in different embodiments. Computer system 2000 may be any of various types of devices, including, but not limited to, a personal computer system, desktop computer, laptop or notebook computer, mainframe computer system, handheld computer, workstation, network computer, a consumer device, application server, storage device, telephone, mobile telephone, or in general any type of computing device.

Computer system 2000 includes one or more processors 2010 (any of which may include multiple cores, which may be single or multi-threaded) coupled to a system memory 2020 via an input/output (I/O) interface 2030. Computer system 2000 further includes a network interface 2040 coupled to I/O interface 2030. In various embodiments, computer system 2000 may be a uniprocessor system including one processor 2010, or a multiprocessor system including several processors 2010 (e.g., two, four, eight, or another suitable number). Processors 2010 may be any suitable processors capable of executing instructions. For example, in various embodiments, processors 2010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA. The computer system 2000 also includes one or more network communication devices (e.g., network interface 2040) for communicating with other systems and/or components over a communications network (e.g. Internet, LAN, etc.).

In the illustrated embodiment, computer system 2000 also includes one or more persistent storage devices 2060 and/or one or more I/O devices 2080. In various embodiments, persistent storage devices 2060 may correspond to disk drives, tape drives, solid state memory, other mass storage devices, block-based storage devices, or any other persistent storage device. Computer system 2000 (or a distributed application or operating system operating thereon) may store instructions and/or data in persistent storage devices 2060, as desired, and may retrieve the stored instruction and/or data as needed. For example, in some embodiments, computer system 2000 may host a storage unit head node, and persistent storage 2060 may include the SSDs that include extents allocated to that head node.

Computer system 2000 includes one or more system memories 2020 that are configured to store instructions and data accessible by processor(s) 2010. In various embodiments, system memories 2020 may be implemented using any suitable memory technology, (e.g., one or more of cache, static random access memory (SRAM), DRAM, RDRAM, EDO RAM, DDR 10 RAM, synchronous dynamic RAM (SDRAM), Rambus RAM, EEPROM, non-volatile/Flash-type memory, or any other type of memory). System memory 2020 may contain program instructions 2025 that are executable by processor(s) 2010 to implement the methods and techniques described herein. In various embodiments, program instructions 2025 may be encoded in platform native binary, any interpreted language such as Java™ byte-code, or in any other language such as C/C++, Java™, etc., or in any combination thereof. For example, in the illustrated embodiment, program instructions 2025 include program instructions executable to implement the functionality of a storage node, in different embodiments. In some embodiments, program instructions 2025 may implement multiple separate clients, nodes, and/or other components.

In some embodiments, program instructions 2025 may include instructions executable to implement an operating system (not shown), which may be any of various operating systems, such as UNIX, LINUX, Solaris™, MacOS™, Windows™, etc. Any or all of program instructions 2025 may be provided as a computer program product, or software, that may include a non-transitory computer-readable storage medium having stored thereon instructions, which may be used to program a computer system (or other electronic devices) to perform a process according to various embodiments. A non-transitory computer-readable storage medium may include any mechanism for storing information in a form (e.g., software, processing application) readable by a machine (e.g., a computer). Generally speaking, a non-transitory computer-accessible medium may include computer-readable storage media or memory media such as magnetic or optical media, e.g., disk or DVD/CD-ROM coupled to computer system 2000 via I/O interface 2030. A non-transitory computer-readable storage medium may also include any volatile or non-volatile media such as RAM (e.g. SDRAM, DDR SDRAM, RDRAM, SRAM, etc.), ROM, etc., that may be included in some embodiments of computer system 2000 as system memory 2020 or another type of memory. In other embodiments, program instructions may be communicated using optical, acoustical or other form of propagated signal (e.g., carrier waves, infrared signals, digital signals, etc.) conveyed via a communication medium such as a network and/or a wireless link, such as may be implemented via network interface 2040.

In some embodiments, system memory 2020 may include data store 2045, which may be configured as described herein. In general, system memory 2020 (e.g., data store 2045 within system memory 2020), persistent storage 2060, and/or remote storage 2070 may store data blocks, replicas of data blocks, metadata associated with data blocks and/or their state, configuration information, and/or any other information usable in implementing the methods and techniques described herein.

In one embodiment, I/O interface 2030 may be configured to coordinate I/O traffic between processor 2010, system memory 2020 and any peripheral devices in the system, including through network interface 2040 or other peripheral interfaces. In some embodiments, I/O interface 2030 may perform any necessary protocol, timing or other data transformations to convert data signals from one component (e.g., system memory 2020) into a format suitable for use by another component (e.g., processor 2010). In some embodiments, I/O interface 2030 may include support for devices attached through various types of peripheral buses, such as a variant of the Peripheral Component Interconnect (PCI) bus standard or the Universal Serial Bus (USB) standard, for example. In some embodiments, the function of I/O interface 2030 may be split into two or more separate components, such as a north bridge and a south bridge, for example. Also, in some embodiments, some or all of the functionality of I/O interface 2030, such as an interface to system memory 2020, may be incorporated directly into processor 2010.

Network interface 2040 may be configured to allow data to be exchanged between computer system 2000 and other devices attached to a network, such as other computer systems 2090, for example. In addition, network interface 2040 may be configured to allow communication between computer system 2000 and various I/O devices 2050 and/or remote storage 2070. Input/output devices 2050 may, in some embodiments, include one or more display terminals, keyboards, keypads, touchpads, scanning devices, voice or optical recognition devices, or any other devices suitable for entering or retrieving data by one or more computer systems 2000. Multiple input/output devices 2050 may be present in computer system 2000 or may be distributed on various nodes of a distributed system that includes computer system 2000. In some embodiments, similar input/output devices may be separate from computer system 2000 and may interact with one or more nodes of a distributed system that includes computer system 2000 through a wired or wireless connection, such as over network interface 2040. Network interface 2040 may commonly support one or more wireless networking protocols (e.g., Wi-Fi/IEEE 802.11, or another wireless networking standard). However, in various embodiments, network interface 2040 may support communication via any suitable wired or wireless general data networks, such as other types of Ethernet networks, for example. Additionally, network interface 2040 may support communication via telecommunications/telephony networks such as analog voice networks or digital fiber communications networks, via storage area networks such as Ethernet, Fibre Channel SANs, or via any other suitable type of network and/or protocol. In various embodiments, computer system 2000 may include more, fewer, or different components than those illustrated in FIG. 20 (e.g., displays, video cards, audio cards, peripheral devices, other network interfaces such as an ATM interface, an Ethernet interface, a Frame Relay interface, etc.)

It is noted that any of the distributed system embodiments described herein, or any of their components, may be implemented as one or more network-based services. For example, a compute cluster within a computing service may present computing and/or storage services and/or other types of services that employ the distributed computing systems described herein to clients as network-based services. In some embodiments, a network-based service may be implemented by a software and/or hardware system designed to support interoperable machine-to-machine interaction over a network. A network-based service may have an interface described in a machine-processable format, such as the Web Services Description Language (WSDL). Other systems may interact with the network-based service in a manner prescribed by the description of the network-based service's interface. For example, the network-based service may define various operations that other systems may invoke, and may define a particular application programming interface (API) to which other systems may be expected to conform when requesting the various operations.

In various embodiments, a network-based service may be requested or invoked through the use of a message that includes parameters and/or data associated with the network-based services request. Such a message may be formatted according to a particular markup language such as Extensible Markup Language (XML), and/or may be encapsulated using a protocol such as Simple Object Access Protocol (SOAP). To perform a network-based services request, a network-based services client may assemble a message including the request and convey the message to an addressable endpoint (e.g., a Uniform Resource Locator (URL)) corresponding to the network-based service, using an Internet-based application layer transfer protocol such as Hypertext Transfer Protocol (HTTP).

In some embodiments, network-based services may be implemented using Representational State Transfer ("RESTful") techniques rather than message-based techniques. For example, a network-based service implemented according to a RESTful technique may be invoked through parameters included within an HTTP method such as PUT, GET, or DELETE, rather than encapsulated within a SOAP message.

Although the embodiments above have been described in considerable detail, numerous variations and modifications may be made as would become apparent to those skilled in the art once the above disclosure is fully appreciated. It is intended that the following claims be interpreted to embrace all such modifications and changes and, accordingly, the above description to be regarded in an illustrative rather than a restrictive sense.

What is claimed is:

1. One or more non-transitory computer readable media storing program instructions, wherein the program instructions when executed on or across one or more processors implement:
   a head node, wherein the head node is configured to:
      serve, when designated, as a primary head node for a volume partition; and
      serve, when designated, as a secondary head node for the volume partition;
   wherein, when designated as a secondary head node for the volume partition, the head node is configured to:
      store write data, included with incoming write requests directed to another head node designated as a primary node for the volume partition, as replicated write data wherein the replicated write data is stored to a log-structured storage of the head node designated as the secondary head node such that the write data is stored in respective log-structured storages of both the other head node and the head node;
      send an acknowledgement to the other head node designated at the primary head node that the write data has been replicated;
      release, subsequent to respective parts of the write data stored in the log-structured storage of the primary head node being stored in mass storage devices, storage space of the log-structured storage of the head node designated as the secondary head node;
   wherein, when designated as a primary head node for the volume partition, the head node is configured to:
      replicate, in response to a failure of one or more of the mass storage device, data corresponding to data stored on the failed one or more mass storage devices to one or more other mass storage devices;
      update an index of the head node designated as the primary head node to indicate new locations of the data for the volume partition; and
      locate, based on the updated index, in response to a request targeting the volume partition, data of the volume partition stored in the head node and the one or more other mass storage devices storing the data that has been replicated.

2. The one or more non-transitory computer readable media of claim 1, wherein:
   the log-structured storage of the head node designated as the secondary head node comprises an index with pointers to where data is stored;
   to perform said store the replicated write data, the program instructions when executed cause the one or more processors to store a replicated version of the write data to a head of a log of the head node designated as the secondary head node's log-structured storage; and
   the program instructions when executed cause the one or more processors cause the head node designated as the secondary head node to add, to the index, an entry that indicates where the written data is stored in the log of the log-structured storage.

3. The one or more non-transitory computer readable media of claim 1, wherein the program instructions when executed cause the head node designated as the secondary head node to:
   write incoming replicated write requests to a head of the log of the head node designated as the secondary head node's log-structured storage;
   add an index entry that indicates where the written data is stored in the head node designated as the secondary head node's log; and
   update the index when the storage space corresponding to the replicated write data is released.

4. The one or more non-transitory computer readable media of claim 1, comprising program instructions, that when executed:
   detect a failed mass storage device in a particular data storage sled;
   cause extents that include columns on the failed mass storage device to be replicated to other extents that include columns on other mass storage devices in other data storage sleds; and update indexes of the head node designated as the secondary head node that includes an extent in the failed mass storage device to indicate the new locations of the data for the volume partition.

5. The one or more non-transitory computer readable media of claim 1, comprising program instructions, that when executed:
in response to a failure of the primary or secondary head node for the volume partition, replicate the data included in the write requests to an additional head node of the data storage system designated as a replacement secondary head node for the volume partition.

6. The one or more non-transitory computer readable media of claim 1, comprising program instructions, that when executed:
store the write data across at least six mass storage devices such that at least four of the mass storage devices store portions of the data, and at least two of the mass storage devices store coded data derived from the data.

7. The one or more non-transitory computer readable media of claim 1,
wherein the head node is included in a system that comprises data storage sleds each comprising a plurality of mass storage devices and a respective sled controller, and the mass storage devices that store the respective parts of the data are in different ones of the data storage sleds; and
wherein the program instructions when executed:
detect a failure of one or more of the mass storage devices in a particular one of the data storage sleds; and
copy data stored in remaining mass storage devices of the data storage sled to mass storage devices in one or more other data storage sleds.

8. A data storage system, comprising:
mass storage devices; and
head nodes, wherein for a volume partition of a volume to be stored in the data storage system, a first of the head nodes is designated as a primary head node for the volume partition, and a second of the head nodes is designated as a secondary head node for the volume partition, the primary head node configured to:
receive a write request from a client of the data storage system;
write data included with the write request for the volume partition to a log-structured storage of the primary head node;
cause the data included with the write request to be replicated to a log-structured storage of the secondary head node;
provide a write acknowledgement to the client in response to the write request subsequent to the data being replicated to the log-structured storage of the secondary head node, wherein the primary head node is configured to provide the write acknowledgement to the client prior to the data being flushed to one or more of the mass storage devices; and
cause, based on a trigger, respective parts of the data stored in the log-structured storage of the primary head node to be flushed to one or more of the mass storage devices.

9. The data storage system of claim 8, wherein:
the log-structured storage of the primary head node and the log-structured storage of the secondary head node comprise respective indexes with pointers to where data is stored;
said write the data comprises write the data included with the request to a head of a log of the respective head node's log-structured storage; and
the respective head nodes are configured to add, to the respective head node's index, an entry that indicates where the written data is stored in the respective head node's log.

10. The data storage system of claim 9, comprising:
an extent comprising columns of the mass storage devices to which the written data stored in the log-structured storage of the primary head node is flushed;
wherein the primary head node is configured to update the primary head node's index when the written data is flushed from the primary head node's log to the extent comprising the columns of the mass storage devices.

11. The data storage system of claim 8, wherein:
said cause respective parts of the data stored in the log-structured storage of the primary head node to be flushed comprises cause the respective parts of the data to be erasure encoded and stored in the mass storage devices;
said trigger comprises:
a quantity of data stored in the log-structured storage of the primary head node exceeding a threshold amount of stored data; or
an amount of time, since data stored in the log-structured storage of the primary head node was stored, exceeding a threshold amount of time.

12. The data storage system of claim 8, further comprising:
data storage sleds, each comprising a plurality of the mass storage devices and a respective sled controller, wherein the mass storage devices that store the respective parts of the data are in different ones of the data storage sleds.

13. The data storage system of claim 8, wherein the primary head node is configured to:
release storage space of the log-structured storage of the primary head node subsequent to said cause respective parts of the data stored in the log-structured storage of the primary head node to be flushed to one or more of the mass storage devices; and
cause storage space of log-structured storage of the secondary head node to be released subsequent to said cause respective parts of the data stored in the log-structured storage of the primary head node to be stored in the mass storage devices.

14. A data storage system, comprising:
a head node, wherein the head node is configured to:
serve, when designated, as a primary head node for a volume partition; and
serve, when designated, as a secondary head node for the volume partition;
wherein, when designated as a primary head node for the volume partition, the head node is configured to:
receive a write request from a client of the data storage system;
write data included with the write request for the volume partition to a log-structured storage of the primary head node;
cause the data included with the write request to be replicated to another head node designated as the secondary head node;
provide a write acknowledgement to the client in response to the write request subsequent to the data being replicated to the log-structured storage of the secondary head node, wherein the primary head node is configured to provide the write acknowledgement to the client prior to the data being flushed to one or more of the mass storage devices; and cause, based on a trigger, respective parts of the data stored in the log-structured storage of the primary head node to be flushed to one or more mass storage devices.

15. The data storage system of claim 14, wherein:

the log-structured storage comprises an index with pointers to where data is stored;

said write the data comprises write the data included with the request to a head of a log of the designated-as-primary head node's log-structured storage; and the head node, when designated as the primary head node, is configured to add, to the index, an entry that indicates where the written data is stored in the corresponding log.

16. The data storage system of claim 14, wherein, when a particular head node is designated as a primary head node for the volume partition, the head node is configured to:

write the write request to a head of a log of the particular head node's log-structured storage;

add an index entry that indicates where the written data is stored in the particular head node's log; and update the index when the written data is flushed from the particular head node's log to an extent comprising columns of the mass storage devices.

17. The data storage system of claim 14, further comprising mass storage device, wherein:

the mass storage devices are arranged in data storage sleds each comprising a plurality of the mass storage devices and a respective sled controller, and the mass storage devices that store the respective parts of the data are in different ones of the data storage sleds;

wherein, when designated as a primary head node for the volume partition, the head node is configured to:

cause storage of the data at a particular level of data durability when stored in the log-structured storage of the head node acting as the primary head node and when stored in a log-structured storage of the other head node designated as the secondary head node; and cause storage of the data, at another level of data durability, when the respective parts of the data are stored in the respective mass storage devices each in different ones of the data storage sleds.

18. The data storage system of claim 17, wherein, when designated as a primary head node for the volume partition, the head node is configured to:

cause the data included in the write request to be replicated to one or more additional head nodes, or adjust a number of data storage sleds across which the data stored in the log-structured storage of the head node is caused to be stored.

19. The data storage system of claim 14, wherein, when designated as a primary head node for the volume partition, the head node is configured to:

cause respective parts of the data stored in the log-structured storage of the head node, designated as the primary head node, to be stored in a plurality of respective mass storage devices asynchronously with the data being stored in the log-structured storage of the head node and in a log-structured storage of another other head node designated as the secondary head node, or instruct the data stored in the log-structured storage of the head node, designated as the primary head node, to be erasure encoded and stored across the mass storage devices to cause respective parts of the data stored in the log-structured storage of the head node, designated as the primary head node, to be stored in the respective mass storage devices.

20. The data storage system of claim 14, wherein, when designated as a primary head node for the volume partition, the head node is configured to:

act as both the primary head node for the volume partition and as a secondary head node for another volume partition stored in the data storage system.

* * * * *